(12) United States Patent
Tomori

(10) Patent No.: US 6,513,095 B1
(45) Date of Patent: Jan. 28, 2003

(54) FILE SYSTEM WITH ASSURED INTEGRITY INCORPORATING SEMICONDUCTOR MEMORY DEVICE

(75) Inventor: Nobuaki Tomori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/568,529

(22) Filed: May 9, 2000

(30) Foreign Application Priority Data

May 31, 1999 (JP) .......................................... 11-153090
Sep. 8, 1999 (JP) .......................................... 11-254973

(51) Int. Cl.[7] .......................... G06F 13/00; G06F 12/02
(52) U.S. Cl. ..................................................... 711/103
(58) Field of Search ........................... 714/22; 711/103, 711/156

(56) References Cited

U.S. PATENT DOCUMENTS 5,544,119 A    8/1996  Wells et al. ............ 365/185.11
5,544,356 A    8/1996  Robinson et al.
6,170,066 B1 *  1/2001  See .............................. 714/22

* cited by examiner

*Primary Examiner*—David L. Robertson
(74) *Attorney, Agent, or Firm*—Morrison & Foerster LLP

(57) ABSTRACT

A file system includes at least one non-volatile semiconductor memory device, the at least one non-volatile semiconductor memory device including a plurality of erasure blocks, each erasure block including a plurality of sectors. The file system includes: a file system memory section for storing block state information for each erasure block, the block state information representing one of a plurality of block states, and for storing sector state information for each sector, the sector state information representing one of a plurality of sector states; and a file system control section for, when accessing the at least one non-volatile semiconductor memory device, guaranteeing integrity of data already stored in the at least one non-volatile semiconductor memory device based on the block state information and on the sector state information in the file system memory section.

22 Claims, 17 Drawing Sheets

FIG. 3

| Physical block number (PBN) | Logical block number (LBN) | Block state |
|---|---|---|
| 0 | 0 | INCLUDES DATA |
| 1 | 1 | BLOCK FULL |
| ⋮ | ⋮ | ⋮ |

FIG. 4

| Physical block number (PBN) | Physical sector number (PSN) | Logical sector number (LSN) | Sector state |
|---|---|---|---|
| 0 | 0 | 100 | DATA VALID |
| 0 | 1 | 10 | DATA INVALID |
| ⋮ | ⋮ | ⋮ | ⋮ |

FIG. 5

| Physical block number (PBN) | Number of "UNUSED" sectors | Number of "DATA VALID" sectors | Number of "DATA INVALID" sectors |
|---|---|---|---|
| 0 | 100 | 20 | 7 |
| 1 | 0 | 50 | 77 |
| ⋮ | ⋮ | ⋮ | ⋮ |

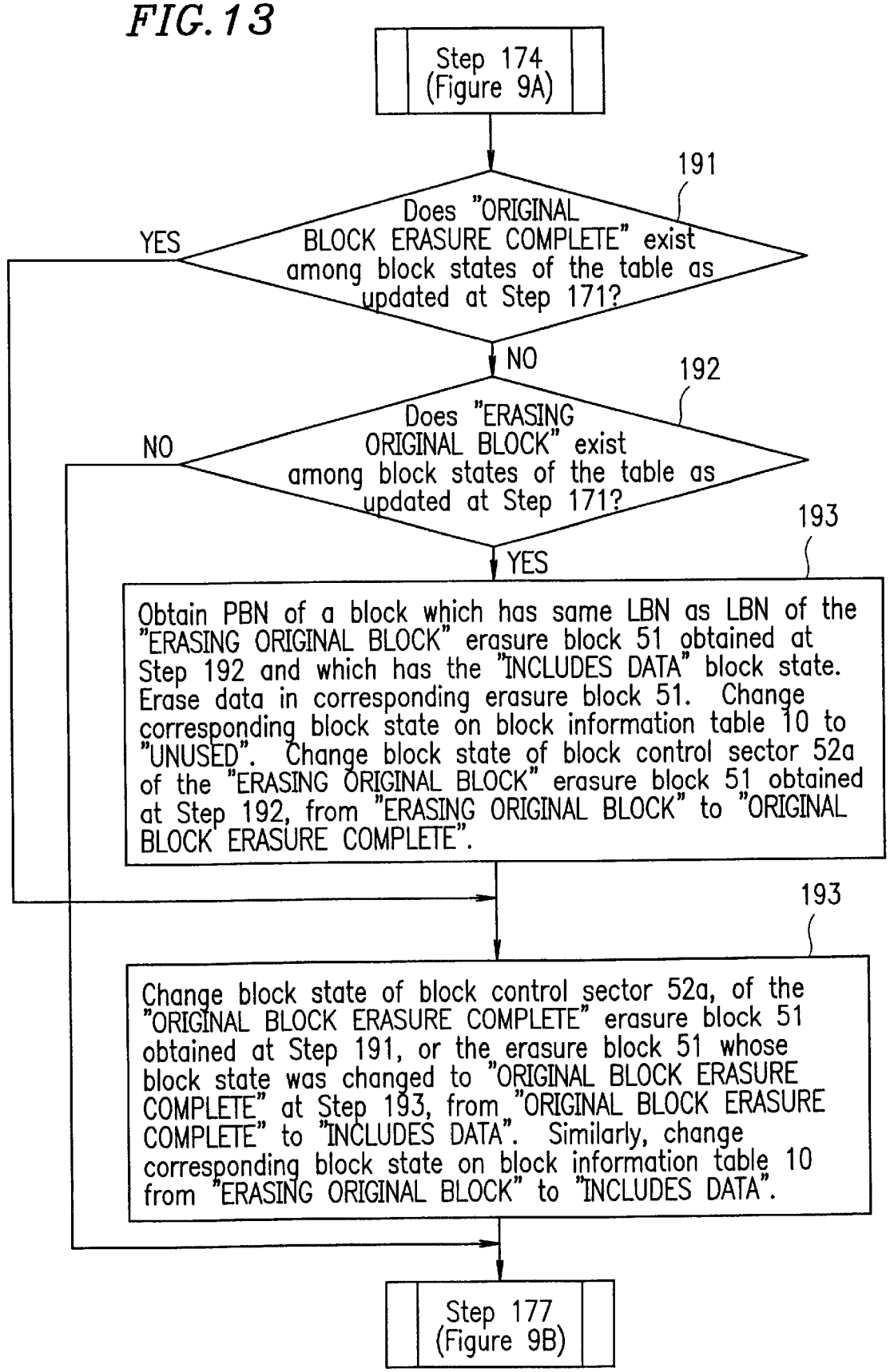

FILE SYSTEM WITH ASSURED INTEGRITY INCORPORATING SEMICONDUCTOR MEMORY DEVICE

BACKGROUND OF THE INVENTION

1. Field of the Invention

The present invention relates to a file system incorporating a non-volatile semiconductor memory device such as a flash memory, and a method for managing such a file system.

2. Description of the Related Art

In recent years, much attention has been paid to techniques for employing a non-volatile semiconductor memory device which is capable of electrically writing and erasing data therein (e.g., a flash memory) as an alternative drive for hard disk drives, which are capable of magnetically writing and erasing data therein.

Flash memories permit data reading at a rate which is about ten thousand times faster than that of hard disk drives, and data writing at a rate which is about one thousand times faster than that of hard disk drives. Other advantages of flash memories include their adaptability to be constructed in small size and with small weight, excellent shock resistance, and excellent portability. Flash memories are especially suitable for storing and reading small amounts of data at a fast rate.

However, flash memories have the following problems. Before writing new data in a storage region of a flash memory in which data is already written, it is necessary to erase existing data. A relatively long data erase time on the order of several dozen milliseconds to several seconds is required because data are deleted in units of several Kbytes. Moreover, flash memories can only guarantee that data can be safely written or erased up to a finite number of times.

In view of the aforementioned disadvantages of flash memories, in order to employ a flash memory as an alternative hard disk drive, it is necessary to provide a file system which is tailored to flash memories, i.e., a file system in which data are processed by units of several hundred bytes (as in hard disk drives) and in which data management is efficiently performed while minimizing data erasure. Such a file system is disclosed in Japanese Laid-Open Publication No. 6-95955, for example.

U.S. Pat. No. 5,544,119 discloses a processing method to be performed at the time when the power supply is restored after an interruption. U.S. Pat. No. 5,544,356 discloses a method for reconstructing a file system.

However, the aforementioned publications do not address situations where a flash memory or a file system for performing various processes may be used with a relatively unstable supply of power, e.g., in the case of using a battery as the power supply means. Hence, any unexpected interruption of the power supply, i.e., if the power supply is interrupted even for a short moment (e.g., due to exhaustion of the battery) during the operation of a flash memory or file system, may make it impossible to properly read the data stored in the flash memory.

The aforementioned problem will be more specifically described. Firstly, the current states of storage regions in which data can be stored (hereinafter referred to as "sectors") are indicated by sector state information, which represents one of the three states "UNUSED" "IN USE", or "INVALID". Therefore, if an interruption of the power supply occurs during update of the data stored in a given sector, the data may incorrectly be recognized as being valid (i.e., not corrupt) even though the data has not been properly updated, based on the sector state information. This process of sector data update will be described with reference to a flowchart shown in FIG. 10.

According to the flowchart shown in FIG. 10, the sector state information of a sector which stores existing data (supposing that this data is to be updated) is changed from "IN USE" to "INVALID" (Step 101). Then, the sector state information of another sector is changed from "UNUSED" to "IN USE" (Step 102). Thereafter, the update data is written to the sectors whose sector state information has been changed to "IN USE" (Step 103). Steps 101 to 103 are repeated until there is no more data to be written.

If the power supply is interrupted immediately after Step 102 or during Step 103, so that the writing of data to the flash memory is suddenly terminated, the sector state information of this sector remains to be "IN USE" although the writing of update data to this sector was not properly completed. Therefore, when the power supply is restored, the file system will incorrectly recognize the data stored in this sector as valid.

Secondly, if an interruption of the power supply occurs in the case where all of the data in one block of sectors (hereinafter referred to as a "target block") is to be erased and thereafter the file system is reconstructed, it is possible that the same data may be left stored in two blocks, or all of the data in the one block may not have been completely erased. This file system reconstruction process will be described with reference to a flowchart shown in FIG. 11.

According to the flowchart shown in FIG. 11, a block is previously secured or reserved as a reserve block, all of whose sectors have had their data erased so that the sector state information of all the sectors in that block indicates "UNUSED". Then, any data within the target block that should be preserved is copied to the reserve block (Step 111). That is, any data except for the data stored in the sectors whose sector state information indicates "INVALID" and the sector state information associated with such sectors must be copied to the reserve block. Furthermore, a block number of the target block, which is included in the location information other than the sectors whose sector state information indicates "INVALID", overwrites the block number of the reserve block (Step 112). Finally, the data in the target block (whose data was copied to the reserve block at Step 111) is erased, and this block is secured as a reserve block for use in a subsequent file system reconstruction (Step 113).

If the power supply is interrupted before the execution of Step 113 or during Step 113, it is possible that the same data may be left stored in two blocks, or all of the data in one block may not have been completely erased, when the power supply is restored. As a result, it is impossible to secure a new reserve block.

SUMMARY OF THE INVENTION

According to the present invention, there is provided a file system including at least one non-volatile semiconductor memory device, the at least one non-volatile semiconductor memory device including a plurality of erasure blocks, each erasure block including a plurality of sectors, wherein the file system includes: a file system memory section for storing block state information for each erasure block, the block state information representing one of a plurality of block states, and for storing sector state information for each sector, the sector state information representing one of a plurality of sector states: and a file system control section for, when accessing the at least one non-volatile semiconductor memory device, guaranteeing integrity of data already stored in the at least one non-volatile semiconductor memory device based on the block state information and on the sector state information in the file system memory section.

In one embodiment of the invention, the file system memory section is provided on a RAM having substantially no constraints concerning data updates, and the file system control section refers to the block state information and the sector state information stored in the RAM when accessing the at least one non-volatile semiconductor memory device.

In another embodiment of the invention, the plurality of block states represented by the block state information include the five states of "UNUSED", "INCLUDES DATA", "BLOCK FULL", "RECEIVING DATA", and "ERASING ORIGINAL BLOCK", and the file system control section includes: means for changing the block state information of a first erasure block from "UNUSED" to "RECEIVING DATA", the first erasure block being previously reserved as a reserve erasure block for use in a file system reconstruction process; means for transferring data stored in a second erasure block to the first erasure block and storing the transferred data in the first erasure block; means for, after completing the transfer and storage of the data, changing the block state information of the first erasure block from "RECEIVING DATA" to "ERASING ORIGINAL BLOCK", erasing the data in the second erasure block, reserving the second erasure block as a new reserve erasure block, and changing the block state information of the second erasure block from "INCLUDES DATA" or "BLOCK FULL" to "UNUSED"; and means for changing the block state information of the first erasure block from "ERASING ORIGINAL BLOCK" to "INCLUDES DATA".

In still another embodiment of the invention, the at least one non-volatile semiconductor memory device includes a plurality of erasure blocks of different block sizes, and at least one erasure block is previously reserved as a reserve erasure block for the erasure blocks of each block size within each non-volatile semiconductor memory device, the reserve erasure block being for use in the file system reconstruction process.

In still another embodiment of the invention, the file system includes a plurality of non-volatile semiconductor memory devices, wherein each non-volatile semiconductor memory device includes a plurality of erasure blocks of different block sizes, and wherein at least one erasure block is previously reserved as a reserve erasure block for the erasure blocks of each block size throughout the plurality of non-volatile semiconductor memory devices, the reserve erasure block being for use in the file system reconstruction process.

In still another embodiment of the invention, the at least one erasure block previously reserved as a reserve erasure block for use in the file system reconstruction process is equal to or larger in size than any other erasure block.

In still another embodiment of the invention, the at least one erasure block previously reserved as a reserve erasure block for use in the file system reconstruction process is equal to or larger in size than any other erasure block.

Alternatively, there is provided a file system including at least one non-volatile semiconductor memory device, the at least one non-volatile semiconductor memory device including a plurality of sectors, wherein the file system includes: a file system memory section for storing sector state information for each sector, the sector state information representing one of a plurality of sector states; a file system control section for, when accessing the at least one non-volatile semiconductor memory device, guaranteeing integrity of data already stored in the at least one non-volatile semiconductor memory device based on the sector state information in the file system memory section, wherein the plurality of sector states represented by the sector state information include the five states of "UNUSED", "WRITING DATA", "DATA WRITE COMPLETE", "DATA VALID", and "DATA INVALID", and wherein the file system control section includes: means for changing the sector state information of a first sector in which data is written from "UNUSED" to "WRITING DATA"; means for changing the sector state information of the first sector from "WRITING DATA" to "DATA WRITE COMPLETE" after the data writing for the first sector is completed; and means for a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

In one embodiment of the invention, the file system control section includes: means for, during initialization of the file system performed when the power supply is restored, searching among the plurality of erasure blocks for an erasure block having the "ERASING ORIGINAL BLOCK" block state information, and if an erasure block having the "ERASING ORIGINAL BLOCK" block state information exists, locating a further erasure block which has the same logic block number as a logic block number of the erasure block having the "ERASING ORIGINAL BLOCK" block state information and which has the "INCLUDES DATA" or "BLOCK FULL" block state information based on the block state information in the file system memory section, means for erasing data in the further erasure block, and after completing the erasure, changing the block state information of the further erasure block from "INCLUDES DATA" or "BLOCK FULL" to "UNUSED", and means for changing the state information of the erasure block having the "ERASING ORIGINAL BLOCK" block state information from "ERASING ORIGINAL BLOCK" to "INCLUDES DATA".

In another embodiment of the invention, the plurality of block states represented by the block state information include the five states of "UNUSED", "INCLUDES DATA", "RECEIVING DATA", "ERASING ORIGINAL BLOCK", and "FORMATTING ORIGINAL BLOCK", and wherein the file system control section includes: means for changing the block state information of a first erasure block from "UNUSED" to "RECEIVING DATA", the first erasure block being previously reserved as a reserve erasure block for use in a file system reconstruction process; means for transferring data stored in a second erasure block to the first erasure block and storing the transferred data in the first erasure block; means for, after completing the transfer and storage of the data, changing the block state information of the first erasure block from "RECEIVING DATA" to "ERASING ORIGINAL BLOCK", erasing the data in the second erasure block, reserving the second erasure block as a new reserve erasure block after completing the erasure, and changing the block state information of the second erasure block from "INCLUDES DATA" to "UNUSED";

means for changing the block state information of the first erasure block from "ERASING ORIGINAL BLOCK"

to "FORMATTING ORIGINAL BLOCK", and formatting, the second erasure block; and means for changing the block state information of the first erasure block from "FORMATTING ORIGINAL BLOCK" to "INCLUDES DATA" after completing the formatting.

In still another embodiment of the invention, each erasure block stores therein an allowable number of erasures to be performed for the erasure block, and the file system control section includes: means for, during the formatting, storing in the second erasure block a number obtained by subtracting one from the allowable number of erasures previously stored in the second erasure block; and means for, during the file system reconstruction process, selecting as the first erasure block an erasure block having a largest allowable number of erasures among all of the plurality of erasure blocks except for the reserve erasure block.

In still another embodiment of the invention, each erasure block is banned from use when the allowable number of erasures of the erasure block equals zero or less.

In still another embodiment of the invention, each erasure block stores therein a number of erasures having been performed for the erasure block, and the file system control section includes: means for, during the formatting, storing in the second erasure block a number obtained by adding one to the number of erasures previously stored in the second erasure block; and means for, during the file system reconstruction process, selecting as the first erasure block an erasure block having a smallest number of erasures among all of the plurality of erasure blocks except for the reserve erasure block.

In still another embodiment of the invention, each erasure block is banned from use when the number of erasures having been performed for the erasure block has exceeded a largest value permitted by specifications of the at least one non-volatile semiconductor memory device.

In still another embodiment of the invention, the at least one non-volatile semiconductor memory device includes a plurality of erasure blocks of different block sizes, and at least one erasure block is previously reserved as a reserve erasure block for the erasure blocks of each block size within each non-volatile semiconductor memory device, the reserve erasure block being for use in the file system reconstruction process.

In still another embodiment of the invention, the file system includes a plurality of non-volatile semiconductor memory devices, wherein each non-volatile semiconductor memory device includes a plurality of erasure blocks of different block sizes, and wherein at least one erasure block is previously reserved as a reserve erasure block for the erasure blocks of each block size throughout the plurality of non-volatile semiconductor memory devices, the reserve erasure block being for use in the file system reconstruction process.

In still another embodiment of the invention, the at least one erasure block previously reserved as a reserve erasure block for use in the file system reconstruction process is equal to or larger in size than any other erasure block.

In still another embodiment of the invention, the at least one erasure block previously reserved as a reserve erasure block for use in the file system reconstruction process is equal to or larger in size than any other erasure block.

Alternatively, there is provided a file system including at least one non-volatile semiconductor memory device, the at least one non-volatile semiconductor memory device including a plurality of sectors, wherein the file system includes: a file system memory section for storing sector state information for each sector, the sector state information representing one of a plurality of sector states; a file system control section, for, when accessing the at least one non-volatile semiconductor memory device, guaranteeing integrity of data already stored in the at least one non-volatile semiconductor memory device based on the sector state information in the file system memory section, wherein the plurality of sector states represented by the sector state information include the five states of "UNUSED", "WRITING DATA", "DATA WRITE COMPLETE", "DATA VALID", and "DATA INVALID", and wherein the file system control section includes: means for changing the sector state information of a first sector in which data is written from "UNUSED" to "WRITING DATA"; means for changing the sector state information of the first sector from "WRITING DATA" to "DATA WRITE COMPLETE" after the data writing for the first sector is completed; and means for a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

In one embodiment of the invention, the file system control section includes: means for, during initialization of the file system performed when the power supply is restored, searching among the plurality of erasure blocks for an erasure block having the "ERASING ORIGINAL BLOCK" block state information, and if an erasure block having the "ERASING ORIGINAL BLOCK" block state information exists, locating a further erasure block from which data is to be transferred to the erasure block having the "ERASING ORIGINAL BLOCK" block state information, based on the block state information in the file system memory section, means for erasing data in the further erasure block, and after completing the erasure, changing the block state information of the further erasure block from "INCLUDES DATA" to "UNUSED", means for changing the block state information of the erasure block having the "ERASING ORIGINAL BLOCK" block state information from "ERASING ORIGINAL BLOCK" to "FORMATTING ORIGINAL BLOCK", formatting the erased further erasure block, and reserving the formatted erasure block as a new reserve erasure block; and means for changing the block state information of the erasure block having the "FORMATTING ORIGINAL BLOCK" block state information from "FORMATTING ORIGINAL BLOCK" to "INCLUDES DATA" after completing the formatting.

In another embodiment of the invention, the file system control section includes: means for, during initialization of the file system performed when the power supply is restored, searching among the plurality of erasure blocks for an erasure block having the "FORMATTING ORIGINAL BLOCK" block state information, and if an erasure block having the "FORMATTING ORIGINAL BLOCK" block state information exists, locating a further erasure block from which data is to be transferred to the erasure block having the "FORMATTING ORIGINAL BLOCK" block state information, based on the block state information in the file system memory section, means for formatting the further erasure block, and reserving the formatted erasure block as a new reserve erasure block; and means for changing the block state information of the erasure block having the "FORMATTING ORIGINAL BLOCK" block state information from "FORMATTING ORIGINAL BLOCK" to "INCLUDES DATA" after completing the formatting.

In another aspect of the invention, there is provided a method for managing a file system including at least one non-volatile semiconductor memory device, the at least one non-volatile semiconductor memory device including a plurality of erasure blocks, each erasure block including a plurality of sectors, wherein the file system includes: a file system memory section for storing block state information for each erasure block, the block state information representing one of a plurality of block states, and for storing sector state information for each sector, the sector state information representing one of a plurality of sector states; and a file system control section for, when accessing the at least one non-volatile semiconductor memory device, guaranteeing integrity of data already stored in the at least one non-volatile semiconductor memory device based on the block state information and on the sector state information in the file system memory section.

Alternatively, there is provided a method for managing a file system including at least one non-volatile semiconductor memory device, the at least one non-volatile semiconductor memory device including a plurality of sectors, wherein the file system includes: a file system memory section for storing sector state information for each sector, the sector state information representing one of a plurality of sector states; a file system control section for, when accessing the at least one non-volatile semiconductor memory device, guaranteeing integrity of data already stored, in the at least one non-volatile semiconductor memory device based on the sector state information in the file system memory section, wherein the plurality of sector states represented by the sector state information include the five states of "UNUSED", "WRITING DATA", "DATA WRITE COMPLETE", "DATA VALID", and "DATA INVALID", and wherein the method includes: a step of changing the sector state information of a first sector in which data is written from "UNUSED" to "WRITING DATA"; a step of changing the sector state information of the first sector from "WRITING DATA" to "DATA WRITE COMPLETE" after the data writing for the first sector is completed; and a step of a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

Alternatively, there is provided a method for managing a file system including at least one non-volatile semiconductor memory device, the at least one non-volatile semiconductor memory device including a plurality of sectors, wherein the file system includes: a file system memory section for storing sector state information for each sector, the sector state information representing one of a plurality of sector states; a file system control section for, when accessing the at least one non-volatile, semiconductor memory device, guaranteeing integrity of data already stored in the at least one non-volatile semiconductor memory device based on the sector state information in the file system memory section, wherein the plurality of sector states represented by the sector state information include the five states of "UNUSED", "WRITING DATA", "DATA WRITE COMPLETE", "DATA VALID", and "DATA INVALID", and wherein the method includes: a step of changing the sector state information of a first sector in which data is written from "UNUSED" to "WRITING DATA"; a step of changing the sector state information of the:first sector from "WRITING DATA" to "DATA WRITE COMPLETE" after the data writing for the first sector is completed; and a step of a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

Thus, the invention described herein makes possible the advantage of providing a file system incorporating a non-volatile semiconductor memory device which is capable of properly reading data that is stored in the non-volatile semiconductor memory device even if an interruption of the power supply occurs.

This and other advantages of the present invention will become apparent to those skilled in the art upon reading and understanding the following detailed description with reference to the accompanying figures.

BRIEF DESCRIPTION OF THE DRAWINGS

FIG. 3 is a data structure diagram ("block information table 10") stored in a file system memory section 3 of the file system shown in FIG. 1, showing the data structure of the respective erasure blocks 51.

FIG. 4 is a data structure diagram ("sector information table 11") stored in the file system memory section 3 of the file system shown in FIG. 1, showing the data structure of the respective sectors 52.

FIG. 5 is a data structure diagram ("sector information table 12") stored in the file system memory section 3 of the file system shown in FIG. 1, showing the number of "UNUSED" sectors 52, the number of "DATA VALID" sectors 52, and the number of "DATA INVALID" sectors 52 in each erasure block 51.

FIG. 13 is a flowchart illustrating a portion of the initialization process for the file system shown in the flowcharts of FIGS. 9A to 9D that corresponds to an example of the invention in which "ORIGINAL BLOCK ERASURE COMPLETE" is set as state information.

DESCRIPTION OF THE PREFERRED EMBODIMENTS

Hereinafter, the present invention will be described by way of examples, with reference to the accompanying figures.

As will be appreciated by those skilled in the art, a flash memory is divided into a plurality of blocks or "erasure blocks". Each erasure block defines a unit whose sectors are simultaneously subjected to an erasure.

Figure 1:
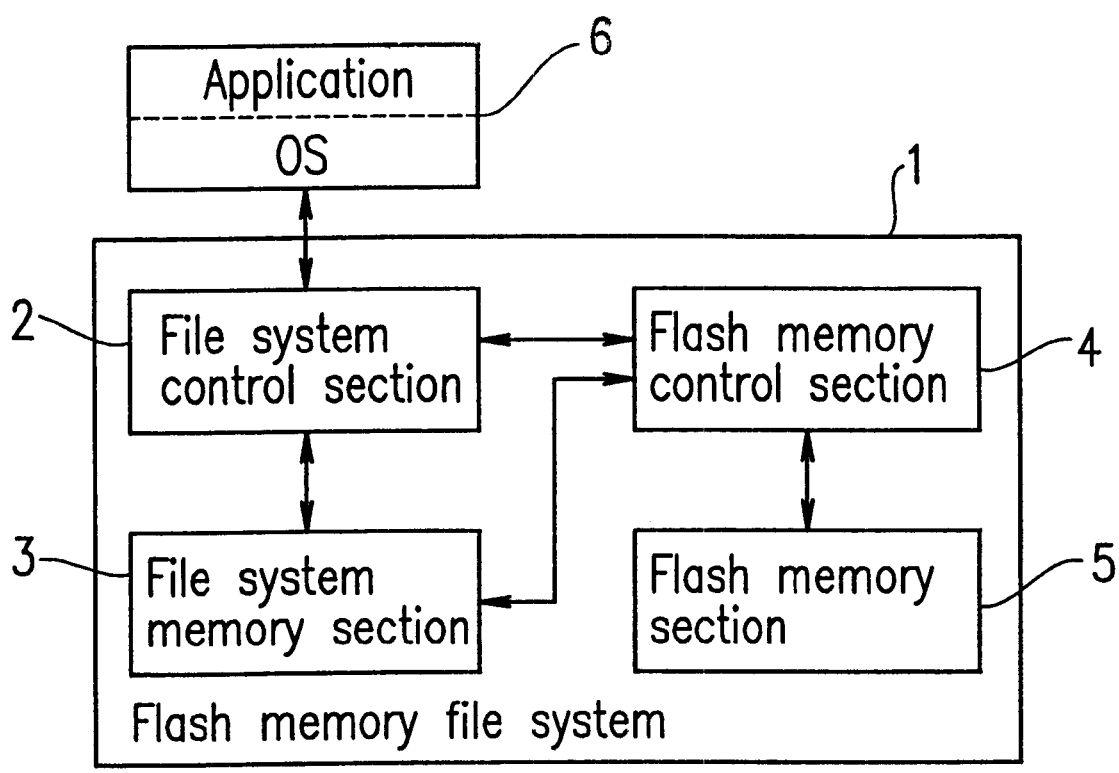
FIG. 1 is a block diagram illustrating a file system according to one example of the present invention.

FIG. 1 illustrates one embodiment of a file system according to the present invention. The file system 1 includes: a file system control section 2 for controlling the processing to take place in the file system 1; a file system memory section 3 used by the file system 1 to store control information; a flash memory section 5; and a flash memory control section 4 for controlling the data processing for the flash memory section 5. Reference numeral 6 denotes an application or operating system which requests the file system 1 to perform data processing.

Figure 2:
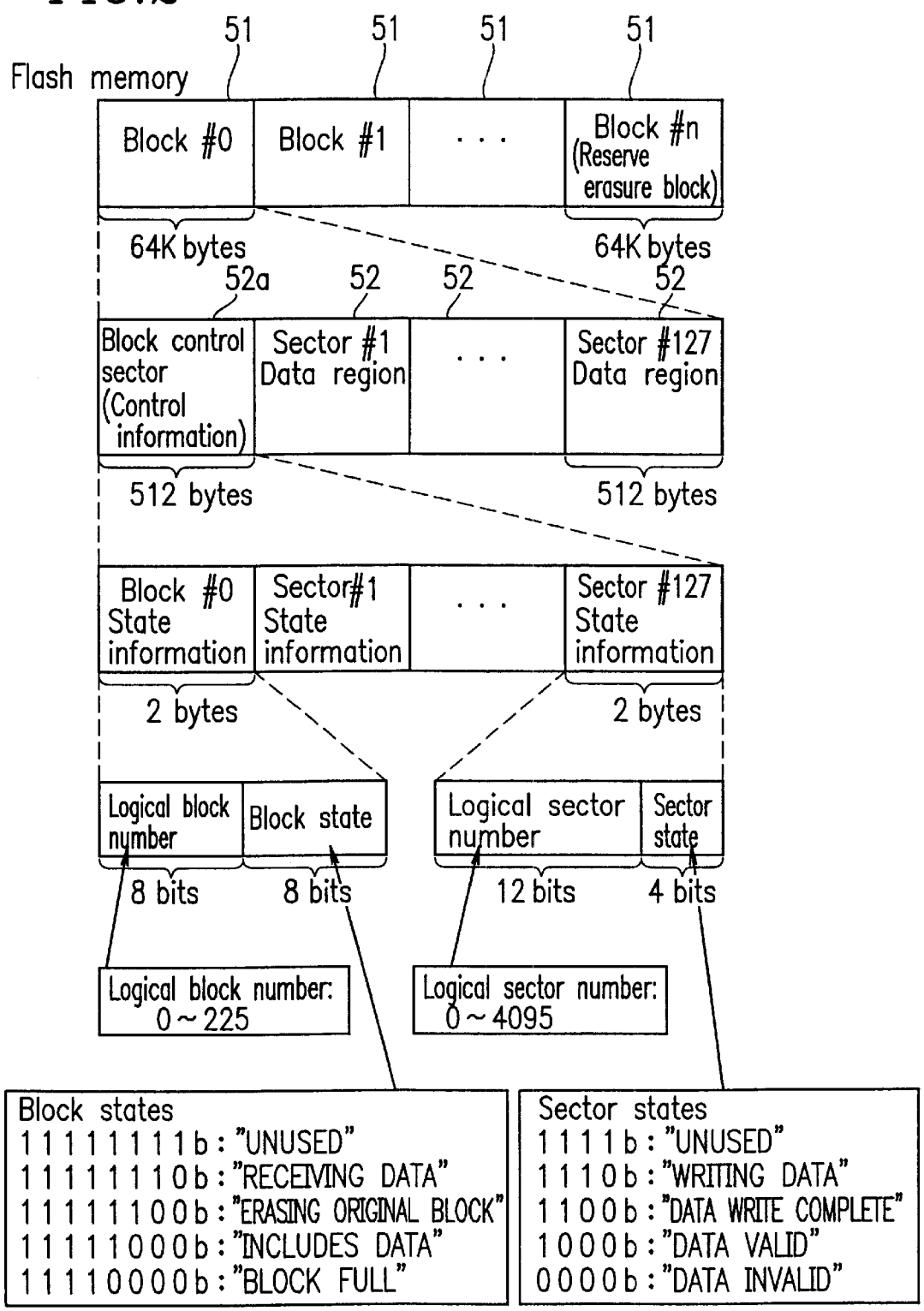
FIG. 2 is a data structure diagram showing the data structure stored in a flash memory section 5 of the file system shown in FIG. 1.

FIG. 2 is a data structure diagram showing the data structure stored in the flash memory section 5. The flash memory section 5 includes blocks of "erasure blocks" 51. Each erasure block 51 is divided into a plurality of physical sectors 52 (which are the minimum units of data by which data is processed). Each physical sector 52 within each erasure block 51 has a unique physical sector number. If each erasure block 51 is 64 Kbytes in size and each physical sector 52 is 512 bytes in size, then each erasure block 51 includes 128 physical sectors 52.

One of the erasure blocks 51 in the flash memory section 5 is secured or reserved in advance as a reserve erasure block (in which data has yet to be written) for use in the reconstruction of the file system 1. The first physical sector 52 of each erasure block 51 is secured in advance as a block control sector 52a for storing the control information for that erasure block 51.

In the block control sector 52a of each erasure block 51, 2 bytes of state information concerning the erasure block 51, 2 bytes of state information concerning the physical sector (#1) 52, 2 bytes of state information concerning the physical sector (#2) 52, . . . 2 bytes of state information concerning the physical sector (#127) 52 are sequentially provided. Thus, the block control sector 52a contains 2 bytes ×128= 256 bytes of information.

The state information concerning the erasure block 51 includes a logical block number (one of 0 to 255) as assigned by the file system control section 2 and data which represents one of the five following block states: (1) "11111111b" representing "UNUSED"; (2) "11111110b" representing "RECEIVING DATA"; (3) "11111100b" representing "ERASING ORIGINAL BLOCK"; (4) "11111000b" representing "INCLUDES DATA"; or (5) "11110000b" representing "BLOCK FULL". The label "b" at the end of each bit string indicates "binary".

Similarly to the state information of the erasure block 51, the state information of each sector 52 of the erasure block 51 includes: a logical sector; number (0 to 4095) which is uniquely assigned within the system by the file system control section 2; and data which represents one of the following five sector states: (I) "1111b" representing "UNUSED"; (II) "1110b" representing "WRITING DATA"; (III) "1100b" representing "DATA WRITE COMPLETE"; (IV) "10000b" representing "DATA VALID"; or (V) "0000b" representing "DATA INVALID". The label "b" at the end of each bit string indicates "binary".

FIG. 3 is a data structure diagram (hereinafter referred to as the "block information table 10") stored in the file system memory section 3 of the file system shown in FIG. 1, which show the data structure of the respective erasure blocks 51.

In the block information table 10 of FIG. 3, each information unit consists of a physical block number, a logical block number, and a block state. Thus, the block information table 10 illustrates an erasure block 51 whose physical block number=0, logical block number=0, and block state= "INCLUDES DATA": an erasure block 51 whose physical block number=1, logical block number=1, and block state= "BLOCK FULL"; and so on.

FIG. 4 is a data structure diagram (hereinafter referred to as the "sector information table 11") stored in the file system memory section 3 of the file system shown in FIG. 1, which shows the data structure of the respective sectors 52.

In the sector information table 11 of FIG. 4, each information unit consists of a physical block number, a physical sector number, a logical sector number, and a sector state. Thus, the sector information table 11 illustrates a sector 52 whose physical block number=0, physical sector number=0, logical sector number=100, and sector state="DATA VALID"; a sector 52 whose physical block number=0, physical sector number=1, logical sector number=10, and sector state="DATA INVALID"; and so on.

FIG. 5 is a data structure diagram (hereinafter referred to as the "sector information table 12") stored in the file system memory section 3 of the file system shown in FIG. 1, showing the number of "UNUSED" sectors 52, the number of "DATA VALID" sectors 52, and the number of "DATA INVALID" sectors 52 in each erasure block 51.

In the sector information table 12 of FIG. 5, each information unit consists of a physical block number, the number of "UNUSED" sector, the number of "DATA VALID" sectors, and the number of "DATA INVALID" sectors. Thus, the sector information table 12 illustrates an erasure block 51 whose physical block number=0, number of "UNUSED" sectors=100, number of "DATA VALID" sectors =20, and number of "DATA INVALID" sectors=7; an erasure block 51 whose physical bloc(k number=1, number of "UNUSED" sectors=0, number of "DATA VALID" sectors= 50, and number of "DATA INVALID" sectors=77; and so on.

The block information table 10 (FIG. 3), the sector information table 11 (FIG. 4), and the sector information table 12 (FIG. 5) are generated by reading the block control sector 52a of each erasure block 51 from the flash memory section 5 at the time when the file system 1 is activated or "booted".

It would be possible to use the file system 1 without generating the block information table 10, the sector information table 11, and the sector information table 12 because the information of these tables is stored in the block control sector 5a of each erasure block 51. However, the file system memory section 3 operates at a faster speed than the flash memory section 5. Therefore, by storing the generated block information table 10, sector information table 11, and sector information table 12 in the file system memory section 3, it becomes possible to quickly grasp the internal state of the flash memory section 5 and where given data is stored. In addition, the operation speed of the file system 1 can be effectively enhanced by utilizing the file system memory section 3 because the amount of data exchanged with the flash memory section 5 is reduced.

Figure 6:
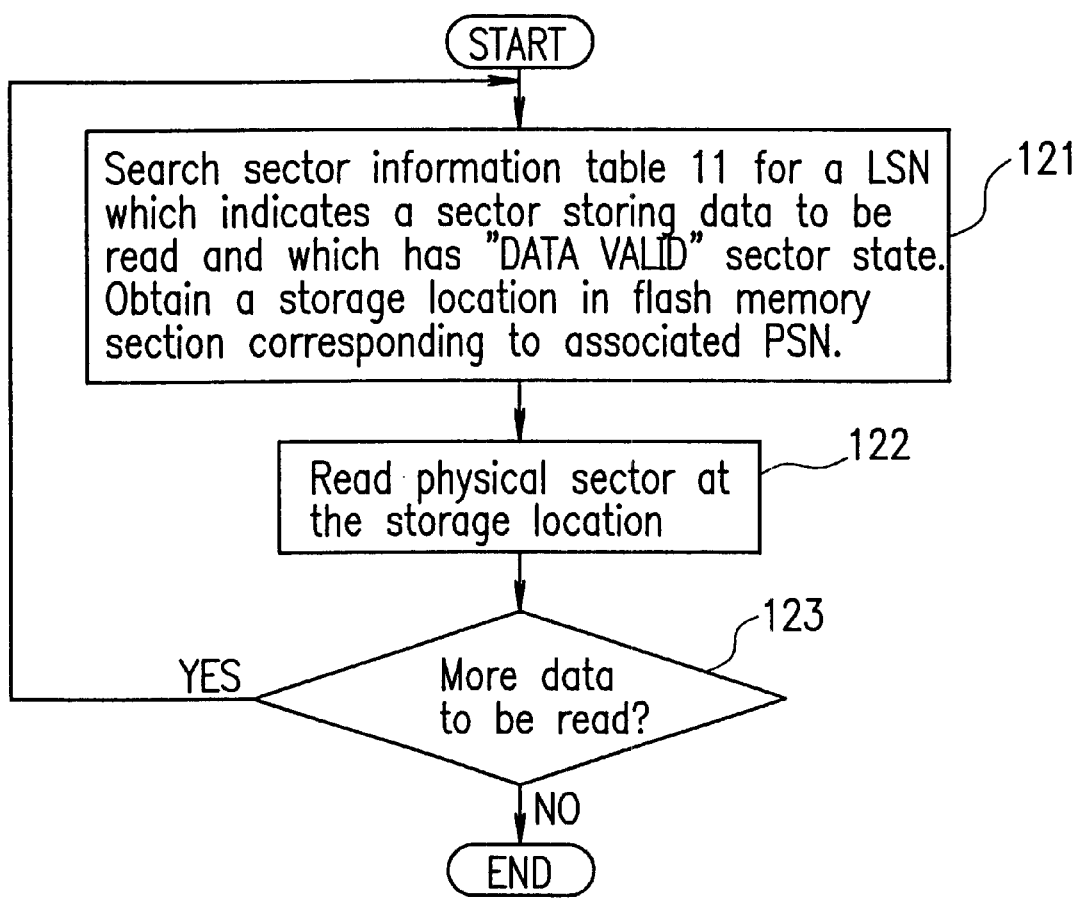
FIG. 6 is a flow(chart illustrating a read operation for data which is stored in the flash memory section 5 of the file system shown in FIG. 1.

FIG. 6 is a flowchart illustrating a read operation for data which is stored in the flash memory section 5 according to the present example of the invention.

First, when a data repaid request for reading data from the flash memory section 5 is issued from the application or operating system 6, the read request and a logical sector number are supplied from the application or operating system 6 to the file system control section 2. The file system control section 2 accesses the sector information table 11 in the file system memory section 3 to search for the supplied logical sector number and confirm that the logical sector number has the "DATA VALID" sector state. The file system control section 2 obtains a physical sector number corresponding to this logical sector number, and supplies the obtained physical sector number to the flash memory control section 4 (Step 121). The flash memory control section 4 accesses the flash memory section 5 based on this physical sector number to perform a read operation for a sector at a physical storage location that corresponds to the physical sector number. The flash memory control section 4 supplies the data which has been read to the file system control section 2 (Step 122). If there is more data to be read, the control returns to Step 121 (following the "YES" path from Step 123). If there is no more data to be read, the control is terminated (following the "NO" path from Step 123).

Figure 7A:
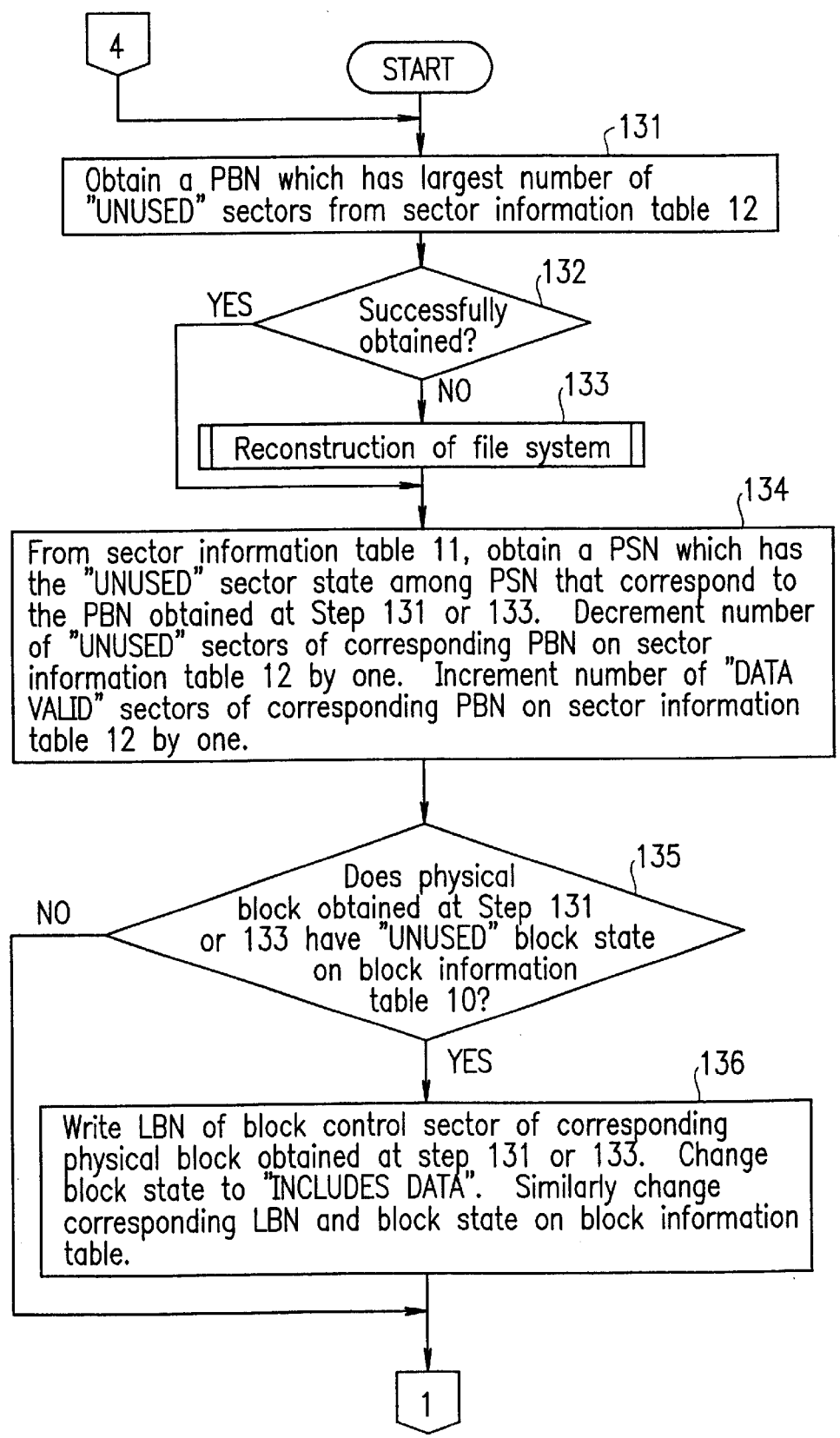
FIGS. 7A to 7C are consecutive flowcharts illustrating a write operation for writing data to the flash memory section 5 shown in FIG. 1.
Figure 7B:
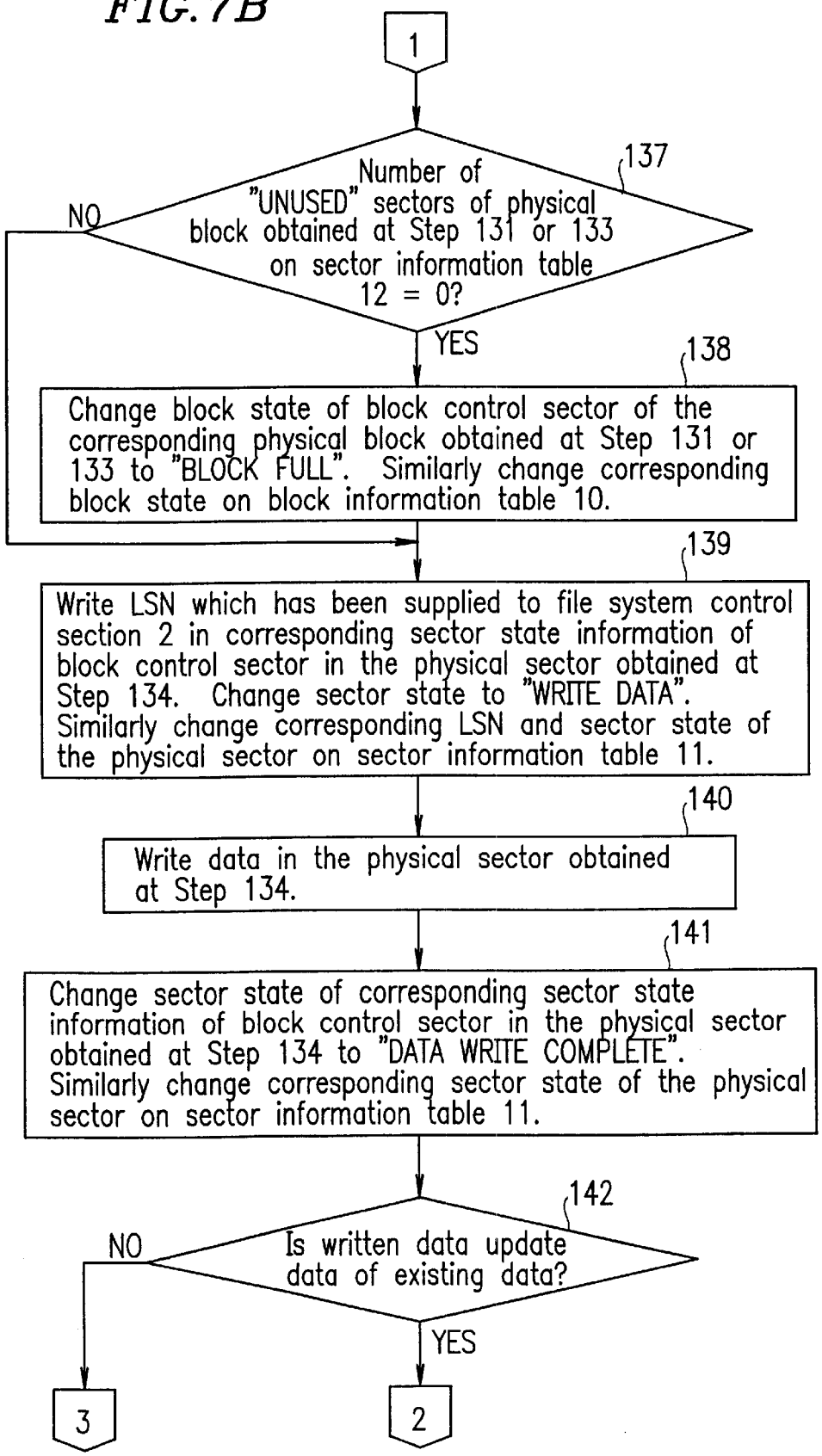
Figure 7C:
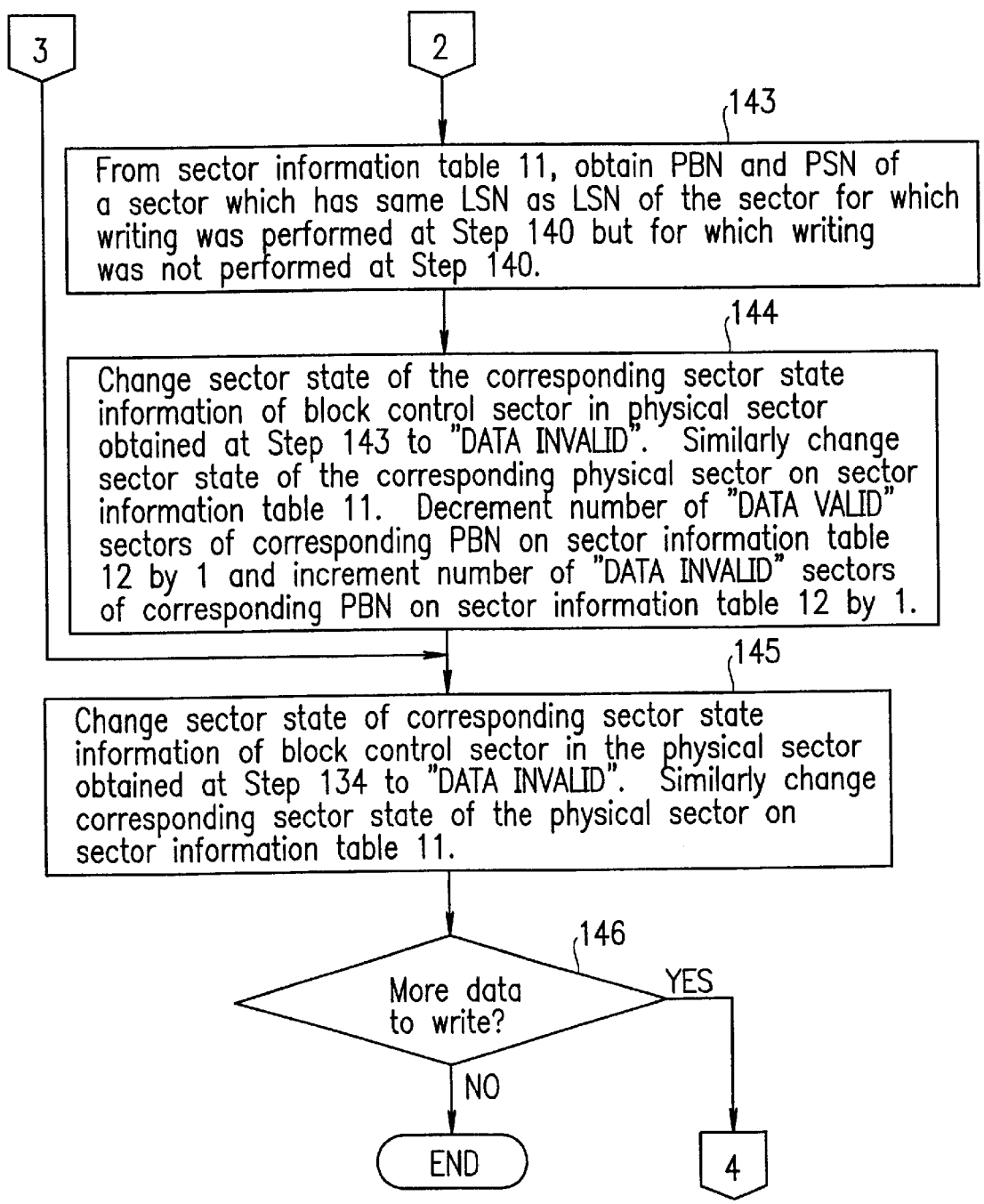

FIGS. 7A to 7C are flowcharts illustrating a write operation for writing data to the flash memory section 5 according to the present example of the invention.

First, when a data write request for writing data to the flash memory section 5 is issued from the application or operating system 6, the write request, a logical sector number, and the data to be written are supplied from the application or operating system 6 to the file system control section 2. The file system control section 2 accesses the sector information table 12 in the file system memory section 3 to obtain a physical block number which has the largest number of "UNUSED" sectors (such a physical block number indicates an erasure block 51 to which writing may be safely performed) (Step 131). The file system control section 2 confirms whether or not a physical block number has been successfully obtained (Step 132). If physical block number has not been successfully obtained (following the "NO" path from Step 132), the file system 1 is reconstructed in order to secure an erasure block 51 to which writing may be safely performed (Step 133).

If a physical block number having the largest number of "UNUSED" sectors has been successfully obtained (following the "YES" path from Step 132), the file system control section 2 accesses the sector information table 11 to obtain a physical sector number which has the "UNUSED" sector state, from among the physical sector numbers that correspond to the physical block number obtained at Step 131 or 133. The file system control section 2 further accesses the sector information table 12 to decrement the number of "UNUSED" sectors corresponding to the physical block number by one and increment the number of "DATA VALID" sectors corresponding to the physical block number by one (Step 134).

Thereafter, the file system control section 2 accesses the block information table 10 to confirm whether the block state associated with the physical block number obtained at Step 131 or 133 is "UNUSED" or not (Step 135). If the block state is confirmed to be "UNUSED" (following the "YES" path from Step 135), the file system control section 2 accesses the flash memory section 5 via the flash memory control section 4. The file system control section 2 changes the logical block number of the block control sector 52a of the erasure block 51 corresponding to the physical block number obtained at Step 131 or 133 to that physical block number, and changes the block state of this block control sector 52a from "UNUSED" to "INCLUDES DATA". Similarly, the file system control section 2 accesses the block information table 10, changes the logical block number corresponding to the physical block number obtained at Step 131 or 133 to that physical block number, and changes the block state of this block control sector 52a from "UNUSED" to "INCLUDES DATA" (Step 136). Then the control proceeds to Step 137. If the block state is not "UNUSED" (following the "NO" path from Step 135), the control skips Step 136 and proceeds to Step 137.

Next, the file system control section 2 accesses the sector information table 12 to confirm whether the number of "UNUSED" sectors corresponding to the physical block number obtained at Step 131 or 133 is 0 or not (Step 137). If the number of "UNUSED" sectors is 0 (following the "YES" path from Step 137), the file system control section 2 accesses the flash memory section 5 via the flash memory control section 4, and changes the block state of the block control sector 52a of the erasure block 51 corresponding to that physical block number from "INCLUDES DATA" to "BLOCK FULL". Similarly, the file system control section 2 accesses the block information table 10, and changes the block state associated with the physical block number obtained at Step 131 or 133 from "INCLUDES DATA" to "BLOCK FULL" (Step 138).

Next, (or following the "NO" path from Step 137) the file system control section 2 accesses the flash memory section 5 via the flash memory control section 4, and writes the logical sector number which has been supplied from the application or operating system 6 in the logical sector number writhing the block control sector 52a of the erasure block 51 that corresponds to the physical block number obtained at Step 131 or 133 and to the physical sector number obtained at Step 134. Also, the file system control section 2 changes the sector state of this sector 52 from "UNUSED" to "WRITING DATA". Similarly, the file system control section 2 accesses the sector information table 11, and changes the logical sector number that corresponds to the physical block number obtained at Step 131 or 133 and to the physical sector number obtained at Step 134 to the logical sector number which has been supplied from the application or operating system 6. Also, the file system control section 2 changes the sector state of this sector 52 from "UNUSED" to "WRITING DATA" (Step 139).

Thereafter, the file system control section 2 accesses the flash memory section 5 via the flash memory control section 4, and writes the data which has been supplied from the application or operating system 6 to the sector 52 that corresponds to the physical block number obtained at Step 131 or 133 and to the physical sector number obtained at Step 134 (Step 140).

After completing writing to the sector 52 within the flash memory section 5, the file system control section 2 changes the sector state within the block control sector 52a of the erasure block 51 that corresponds to the physical block number obtained at Step 131 or 133 and to the physical sector number obtained at Step 134 from "WRITING DATA" to "DATA WRITE COMPLETE". Similarly, the file system control section 2 accesses the sector information table 11, and changes the sector state that corresponds to the physical block number obtained at Step 131 or 133 and to the physical sector number obtained at Step 134 from "WRITING DATA" to "DATA WRITE COMPLETE" (Step 141).

Then, the file system control section 2 confirms whether or not the data which has been written to the sector 52 within the flash memory section 5 is update data of any data that has already been written in the flash memory section 5 (Step 142). If the written data is update data, (following the "YES" path from Step 142), the file system control section 2 accesses the sector information table 11, and obtains the physical sector number and the physical block number of a sector 52 in which any existing data is storied (i.e., a sector 52 which has the same logical sector number as the logical sector number of the sector 52 for which writing was performed at Step 140 but which has a different physical sector number from the physical sector number of the sector 52 for which writing was performed at Step 140) (Step 143). Then, the file system control section 2 accesses the flash memory section 5 via the flash memory control section 4, and changes the sector state within the block control sector 52a of the erasure block 51 that corresponds to the aforementioned physical block number and physical sector number from "DATA VALID" to "DATA INVALID". Similarly, the file system control section 2 accesses the sector information table 11, and changes the sector state that corresponds to the aforementioned physical block number and physical sector number from "DATA VALID" to "DATA INVALID". The file system control section 2 further accesses the sector information table 12 to decrement the number of "DATA VALID" sectors corresponding to this physical block number by one and increment the number of "DATA INVALID" sectors corresponding to this physical block number by one (Step 144).

Thereafter, the file system control section 2 accesses the flash memory section 5 via the flash memory control section 4, and changes the sector state within the block control sector 52a of the erasure block 51 that corresponds to the physical block number obtained at Step 131 or 133 and to the physical sector number obtained at Step 134 from "DATA WRITE COMPLETE" to "DATA VALID". Similarly, the file system control section 2 accesses the sector information table 11, and changes the sector state that is associated with the aforementioned physical block number and physical sector number from "DATA WRITE COMPLETE" to "DATA VALID" (Step 145).

Subsequently, the file system control section 2 confirms whether there is air more data to be written (Step 146). If there is more data to be written (following the "YES" path from Step 146), the control returns to Step 131. If there is no more data to be written (following the "NO" path from Step 146), the control is terminated.

Figure 8A:
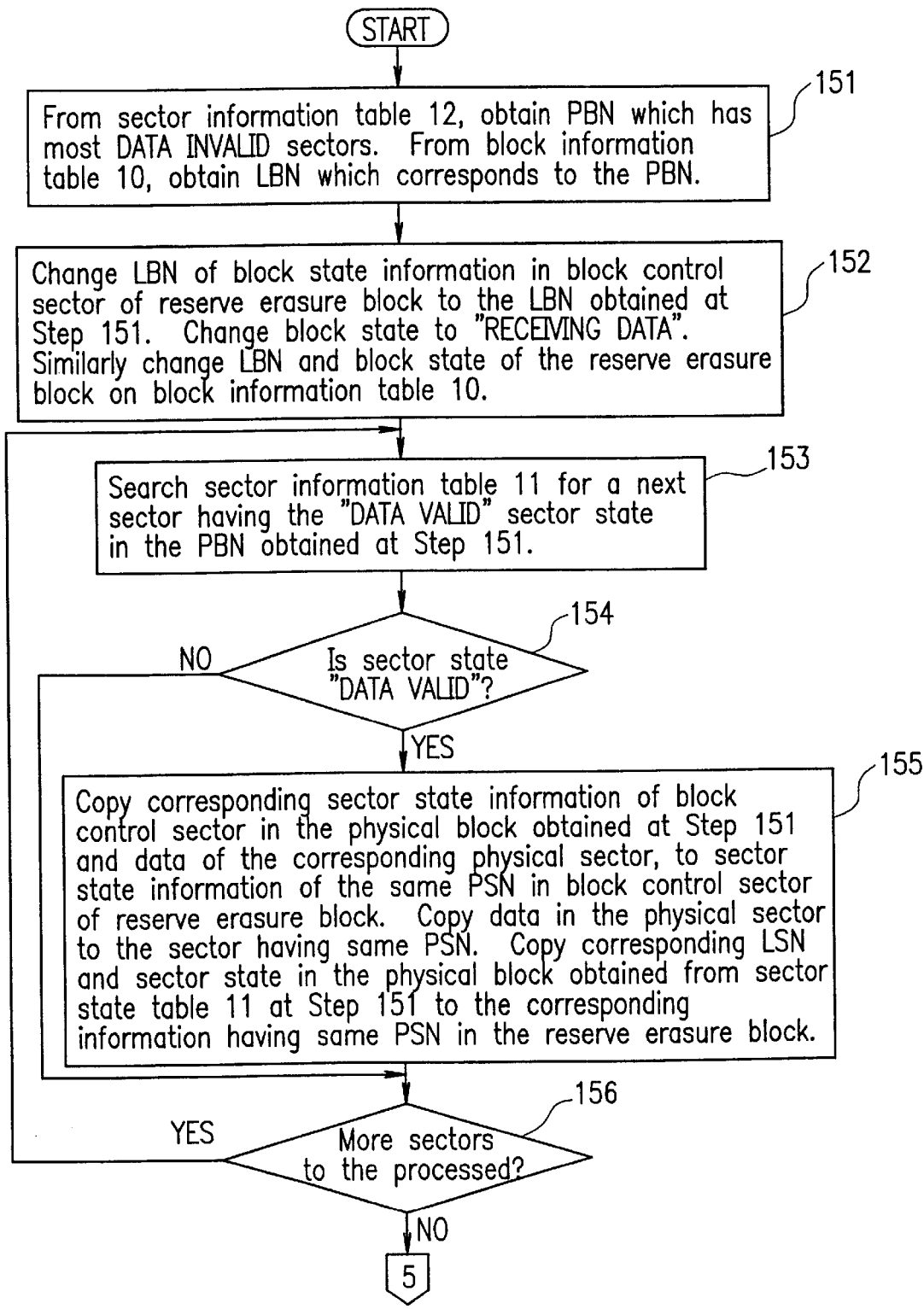
FIGS. 8A and 8B are consecutive flowcharts illustrating a reconstruction process for the file system 1 according to the present example.
Figure 8B:
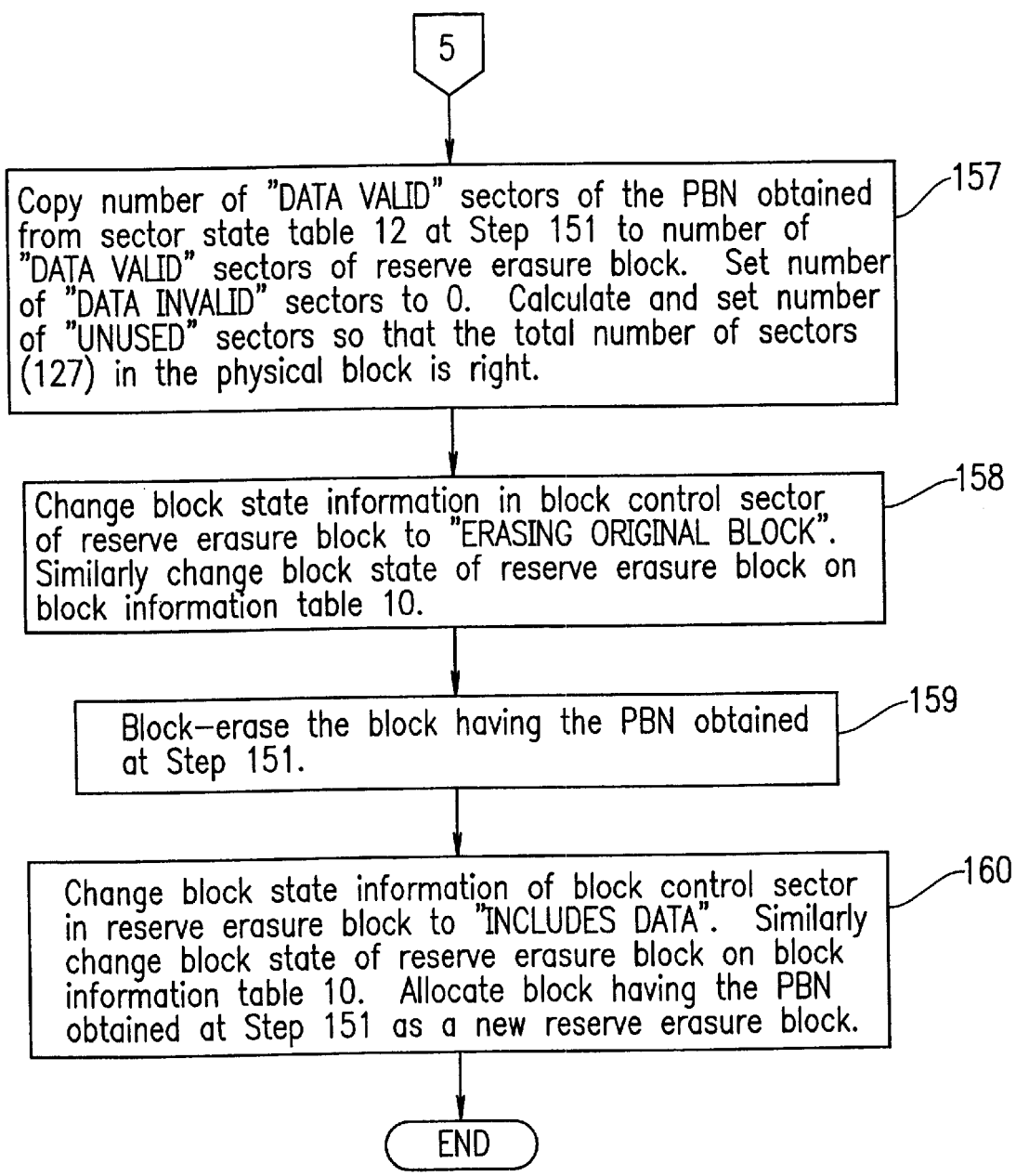

FIGS. 8A and 8B are flowcharts illustrating a reconstruction process for the file system 1 according to the present example.

First, if an erasure block 51 to which writing may be safely performed was not successfully obtained (following the "NO" path from Step 132) during the flow of control illustrated in the flowcharts of FIGS. 7A to 7C, the file system is reconstructed in order to secure an erasure block 51 to which writing may be safely performed (Step 133). The reconstruction process of Step 133 is illustrated in the flowcharts of FIGS. 8A and 8B.

In FIGS. 8A and 8B, the file system control section 2 accesses the sector information table 12, receives a physical block number which has the largest number of "DATA INVALID" sectors. The file system control section 2 also accesses the block information table 10 to obtain a logical block number that corresponds to the obtained physical block number (Step 151). The file system control section 2 accesses the flash memory section 5 via the flash memory control section 4, and changes the logical block number of the block control sector 52a of the reserve erasure block 51 (in which data has yet to be written) that has been secured in advance for use in the reconstruction of the file system to the logic block number obtained at Step 151, and changes the block state of the block control sector 52a from "UNUSED" to "RECEIVING DATA". Similarly, the file system control section 2 accesses the block information table 10, changes the logical block number of the reserve erasure block 51 to the logical block number obtained at Step 151, and changes the block state from "UNUSED" to "RECEIVING DATA" (Step 152).

Next, in order to efficiently copy data from the erasure block 51 having the physical block number obtained at Step 151 to the reserve erasure block 51, the file system control section 2 accesses the sector information table 11, and searches for and obtains a physical sector number which has the "DATA VALID" sector state, among the physical sector numbers corresponding to the physical block number obtained at Step 151 (Step 153).

If a sector 52 exists which has the "DATA VALID" sector state (following the "YES" path from Step 154), the file system control section 2 accesses the flash memory section 5 via the flash memory control section 4, and copies a "DATA VALID" sector state within the block control sector 52a of the erasure block 51 that corresponds to the physical block number obtained at Step 151 and to the physical sector number obtained at Step 153, to a sector state within the block control sector 52a of the reserve erasure block 51 that corresponds to the same physical sector number. Similarly, the file system control section 2 accesses the sector information table 11, and copies the "DATA VALID" sector state that corresponds to the physical block number obtained at Step 151 and to the physical sector number obtained at Step 153, to the sector state of the same physical sector number within the reserve erasure block 51. At the same time, the file system control section 2 accesses the flash memory section 5 via the flash memory control section 4, and copies data from the sector 52 within the erasure lock 51 that corresponds to the physical block number obtained at Step 151 and to the physical sector number obtained at Step 153, to the sector 52 having the same physical sector number within the reserve erasure block 51 (Step 155).

Next, (or following the "NO" path from Step 154), the file system control section 2 confirms whether or not an unprocessed sector 52 exists in the erasure block 51 having the physical block number obtained at Step 151 (Step 156). If an unprocessed sector 52 exists (following the "YES" path from Step 156), the control returns to Step 153. If no unprocessed sector 52 exists (following the "NO" path from Step 156), the data copying has been completed. Accordingly, the file system control section 2 accesses the sector information table 12, and copies the number of "DATA VALID" sectors corresponding to the physical block number obtained at Step 151 to the number of "DATA VALID" sectors in the reserve erasure block 51. The file system control section 2 sets the number of "DATA INVALID" sectors to 0. The file system control section 2 calculates and sets the number of "UNUSED" sectors so that the sum of the number of "DATA VALID" sectors, the number of "DATA INVALID" sectors, and the number of "UNUSED" sectors equals the total number of sectors (i.e., 127) (Step 157).

Next, the file system control section 2 accesses the flash memory section 5 via the flash memory control section 4, and changes the block state of the block control sector 52a of the reserve erasure block 51 from "RECEIVING DATA" to "ERASING ORIGINAL BLOCK" (Step 158); then erases the data in the erasure block 51 having the physical block number obtained at Step 151 (Step 159); and then changes the block state of the block control sector 52a of the reserve erasure block 51 from "ERASING ORIGINAL BLOCK" to "INCLUDES DATA". Similarly, the file system control section 2 accesses the block information table 10, and changes the block state of the block control sector 52a of the reserve erasure block 51 from "RECEIVING DATA" to "ERASING ORIGINAL BLOCK" (Step 158), and after Step 159, changes the block state of the reserve erasure block 51 from "ERASING ORIGINAL BLOCK" to "INCLUDES DATA". Thus, the block having the physical block number obtained at Step 151, i.e., the block whose data has been erased, is secured as a new reserve erasure block 51 (Step 160).

At this time, the block state of the block control sector 52a of the erasure block 51 whose data was erased at Step 159 automatically changes from "INCLUDES DATA"or "BLOCK FULL" to "UNUSED" through the data erasure. In the block information table 10, the sector information table 11, and the sector information table 12, the erasure block 51 whose data was erased at Step 159 appears as a reserve erasure block since the reserve erasure block will not be referred to during a data write operation for the flash memory section 5, the items corresponding to the physical block number of the reserve erasure block do not need to be changed.

Although the above example illustrates a case where one erasure block 51 is erased during the reconstruction of the file system 1, it is also possible to perform the series of processes after Step 151 a plurality of times.

FIGS. 9A to 9D are flowcharts illustrating an initialization process for the file system 1 according to an example of the present invention. The initialization process is to be performed once during the boot of the file system 1, i.e., at the time when the power supply is restored after an interruption. The initialization process guarantees that the data stored in the flash memory section 5 can be successfully read.

First, the file system control section 2 accesses the flash memory section 5 via the flash memory control section 4, and reads the block state of the block control sector 52a of each erasure block 51. Based on the block information, the file system control section 2 updates the block information on the block information table 10 (Step 171), and confirms whether any more erasure blocks 51 remain to be processed (Step 172). The file system control section 2 repeats the process of Step 171 until no more erasure blocks 51 remain to be processed.

Next, following the "NO" path from Step 172 (i.e., if no more erasure blocks 51 remain to be processed), the file system control section 2 accesses the block information table 10 (as updated at Step 171) to confirm whether or not the "RECEIVING DATA" block state is present (Step 173). If the "RECEIVING DATA" block state is present (following the "YES" path from Step 173), the file system control section 2 obtains the physical block number exhibiting this block state, and changes the block state associated with this physical block number from "RECEIVING DATA" to "UNUSED" (Step 174). At the same time, the file system control section 2 accesses the flash memory section 5 via the flash memory control section 4, and erases the data in the block having this physical block number.

In the case where the power supply was interrupted during the execution of Steps 151 to 157, resulting in an interruption of data transfer to a reserve erasure block 51, this reserve erasure block 51 is expected to retain the "RECEIV-ING DATA" block state. When the power supply is restored later, the data stored in the reserve erasure block 51 which exhibits the "RECEIVING DATA" block state due to the interruption of data transfer is erased, so that the block state of this reserve erasure block 51 is changed to "UNUSED" during the processes of Steps 173 and 174. As a result, any inconsistent data in the reserve erasure block 51 is prevented from being read.

Next, (or following the "NO" path from Step 173) the file system control section 2 accesses the block information table 10 (as updated at Step 171) to confirm whether or not any block exists that has the "ERASING ORIGINAL BLOCK" block state (Step 175). If a block having the "ERASING ORIGINAL BLOCK" block state exists, the file system control section 2 obtains a physical block number which is associated with the same logical block number as the logical block number of this block and which has the "INCLUDES DATA" block state. Then, the file system control section 2 accesses the block information table 10, and changes the block state associated with this physical block number to "UNUSED". At the same time, the file system control section 2 accesses the flash memory section 5 via the flash memory control section 4, and erases the data in the block having this physical block number.

Moreover, the file system control section 2 changes the block state information in the block control sector 52a of the erasure block 51 which corresponds to the physical block number having the "ERASING ORIGINAL BLOCK" block state (obtained at Step 175) from "ERASING ORIGINAL BLOCK" to "INCLUDES DATA". The file system control section 2 changes the block state associated with this physical block number in the block information table 10 to "INCLUDES DATA" (Step 176).

Thereafter, the file system control section 2 reads the sector state of the block control sector 52a of the erasure block 51, and updates the sector information table 11 in the file system memory section 3 based on this sector information (Step 177). The file system control section 2 confirms whether or not any more sector information remains to be processed (Step 178). If more sector information remains to be processed (following the "YES" path from Step 178), the control returns to Step 177 and repeats the process until no more sector information remains to be processed. Similarly, if any more erasure blocks 51 remain to be processed, the control returns to Step 177, and repeats the process until no more erasure blocks 51 remain to be processed.

In the case where the power supply was interrupted during the execution of Steps 158 to 160 (FIGS. 8A and 8B), this reserve erasure block 51 is expected to retain the "ERAS-ING ORIGINAL BLOCK" block state, meaning that the data transfer to this reserved erasure block 51 is complete. When the power supply is restored later, the data in the reserve erasure block 51 is conserved through the processes of Steps 175 to 178, and the data in the original erasure block 51 (i.e., the erasure block from which the data transfer occurred) is erased. As a result, any inconsistent data in the original erasure block 51 from which the data transfer occurred is prevented from being read.

Next, following the "NO" path from Step 178, the file system control section 2 accesses the sector information table 11 (as updated at Step 177) to confirm whether or not any sector 52 exists that has the "WRITING DATA" sector state (Step 179). If a sector 52 having the "WRITING DATA" sector state exists (following the "YES" path from Step 179), the file system control section 2 obtains a physical block number and a physical sector number which exhibits the "WRITING DATA" sector state (as obtained in Step 179). The file system control section 2 accesses the flash memory section 5 via the flash memory control section 4, and changes the sector state within the block control sector 52a of the erasure block 51 that corresponds to the aforementioned physical block number and physical sector number from "WRITING DATA" to "DATA INVALID". Similarly, the file system control section 2 accesses the sector information table 11, and changes the sector state associated with the aforementioned physical block number and physical sector number from "WRITING DATA" to "DATA INVALID" (Step 180).

Next, (or following the "NO" path from Step 179) the file system control section 2 accesses the sector information table 11 to confirm whether or not any sector 52 exists that has the "DATA WRITE COMPLETE" sector state (Step 181). If a sector 52 having the "DATA WRITE COMPLETE" sector state exists (following the "YES" path from Step 181), the file system (control section 2 confirms whether or not another sector 52 exists which has the same logical sector number as the logical sector number of this sector 52 and which has the "DATA VALID" sector state (Step 182). If such a sector 52 exists (following the "YES" path from Step 182), the file system control section 2 obtains the physical block number and the physical sector number of that sector 52. The file system control section 2 accesses the flash memory section 5 via the flash memory control section 4, and changes the sector state within the block control sector 52a of the erasure block 51 that corresponds to the aforementioned physical block number and physical sector number from "DATA VALID" to "DATA INVALID". Similarly, the file system control section 2 accesses the sector information table 11, and changes the sector state associated with the aforementioned physical block number and physical sector number from "DATA VALID" to "DATA INVALID" (Step 183).

Next, the file system control section 2 accesses the sector information table 11, and obtains the physical block number and the physical sector number of the sector 52 which has the "DATA WRITE COMPLETE" sector state (obtained at Step 181). The file system control section 2 accesses the flash memory section 5 via the flash memory control section 4, and changes the sector state within the block control sector 52a of the erasure block 51 that corresponds to the above physical block number and physical sector number from "DATA WRITE COMPLETE" to "DATA VALID". Similarly, the file system control section 2 accesses the sector information table 11, and changes the sector state associated with the above physical block number and physical sector number from "DATA WRITE COMPLETE" to "DATA VALID" (Step 184).

In the case where the power supply was interrupted during the execution of Steps 139 to 141 (FIGS. 7A to 7C), the "WRITING DATA" sector state is expected to be retained if the data write operation was interrupted. Alternatively, the "DATA WRITE COMPLETE" sector state is expected to be retained if the data write operation had been completed. When the power supply is restored later, the data in the sector 52 for which data writing was interrupted (having the "WRITING DATA" sector state) is erased through the processes of Steps 179 to 184, and the sector 52 takes the "DATA INVALID" sector state. As a result, any inconsistent data in the sector 52 for which data writing was interrupted is prevented from being read. Since the data in the sector 52 having the "DATA WRITE COMPLETE" sector state is conserved and this sector state is changed to "DATA VALID", the data from this sector 52 can be properly read.

Next, (or following the "NO" path from Step 181 or 182) the file system control section 2 accesses the sector information table 11 to count the number of "UNUSED" sectors, the number of "DATA VALID" sectors, and the number of "DATA INVALID" sectors for every physical block number. Based on these calculated values, the file system control section 2 updates the physical block numbers, the number of "UNUSED" sectors, the number of "DATA VALID" sectors, and the number of "DATA INVALID" sectors in the sector information table 12 in the file system memory section 3 (Step 185). The file system control section 2 confirms whether or not any more physical block numbers remain to be processed (Step 186). If more physical block numbers remain to be processed (following the "YES" path from Step 186), the control returns to Step 185 to repeat the process until no more physical block numbers remain to be processed.

Thereafter, following the "NO" path from Step 186, based on the block information table 10 as updated at Steps 171, 174, and 175, the file system control section 2 secures one erasure block 51 which has a physical block number that exhibits the "UNUSED" block state as a reserve erasure block 51 (Step 187).

Thus, the initialization process is completed.

In the above-described example, the state information of the respective erasure blocks 51 and the respective sectors 52 is frequently rewritten at various points, e.g., data write or file system reconstruction processes. Accordingly, if the power supply is inadvertently interrupted, it is possible to erase any uncertain data in the erasure blocks 51 and sectors 52 based on the state information concerning the erasure blocks 51 and sectors 52 when the power supply is restored later. As a result, only the proper data is conserved.

The above-described example illustrates the five following block states: (1) "11111111b" representing "UNUSED"; (2) "11111110b" representing "RECEIVING DATA"; (3) "11111100b" representing "ERASING ORIGINAL BLOCK"; (4) "11111000b" representing "INCLUDES DATA"; or (5) "11110000b" representing "BLOCK FULL", (where the label "b" at the end of each bit string indicates "binary"). Alternatively, a more complicated combination of the "0" bits and "1" bits may be adopted, and/or the number of bits may be increased, so as to more securely determine the differences between these states.

It would also be possible to employ six or more block states for the sectors 52 to more closely monitor the block states.

The above-described example illustrates the following five sector states: (I) "1111b" representing "UNUSED"; (II) "1110b" representing "WRITING DATA"; (III) "1100b" representing "DATA WRITE COMPLETE"; (IV) "1000b" representing "DATA VALID"; or (V) "0000b" representing "DATA INVALID". Alternatively, a more complicated combination of the "0" bits and "1" bits may be adopted, and/or the number of bits may be increased, so as to more securely determine the differences between these states.

It would also be possible to employ six or more sector states to more closely monitor the sector states.

The above-described example illustrates a flash memory having blocks of equal sizes. Alternatively, in the case of a flash memory having a boot block structure, it is possible to previously secure one erasure block for a boot block, and one erasure block for any other block, both secured as reserve erasure blocks for use in the reconstruction of the file system 1. For example, if the boot block is 8 Kbytes in size, then an erasure block which is 8 Kbytes in size may be arbitrarily selected as a reserve erasure block therefor. For any other type of blocks which may be e.g., 64 bytes in size, an erasure block which is 64 Kbytes in size may be arbitrarily selected as a reserve erasure block therefor. Adopting this principle would enable those who design a file system to select a flash memory from among either equal-block types or boot-block types, depending on the specific purpose and/or cost requirements of each system. It is also be possible to allocate a block which is larger than 8 Kbytes (e.g., 64 Kbytes) as a reserve erasure block for a boot block which is e.g., 8 Kbytes. Such an arrangement will facilitate the management of the reserve erasure blocks since they are of equal sizes.

In the case where the file system 1 according to the present example of the invention incorporates a plurality of flash memories, every flash memory may have one erasure block allocated therefor as a reserve erasure block for use in the reconstruction of the file system. Alternatively, it is also possible to allocate one reserve erasure block for a plurality of flash memories, or allocate at least one reserve erasure block for every type of erasure blocks that are of different block sizes across a plurality of flash memories. In such cases, the number of reserve erasure blocks to be secured can be effectively reduced.

Figure 9A:
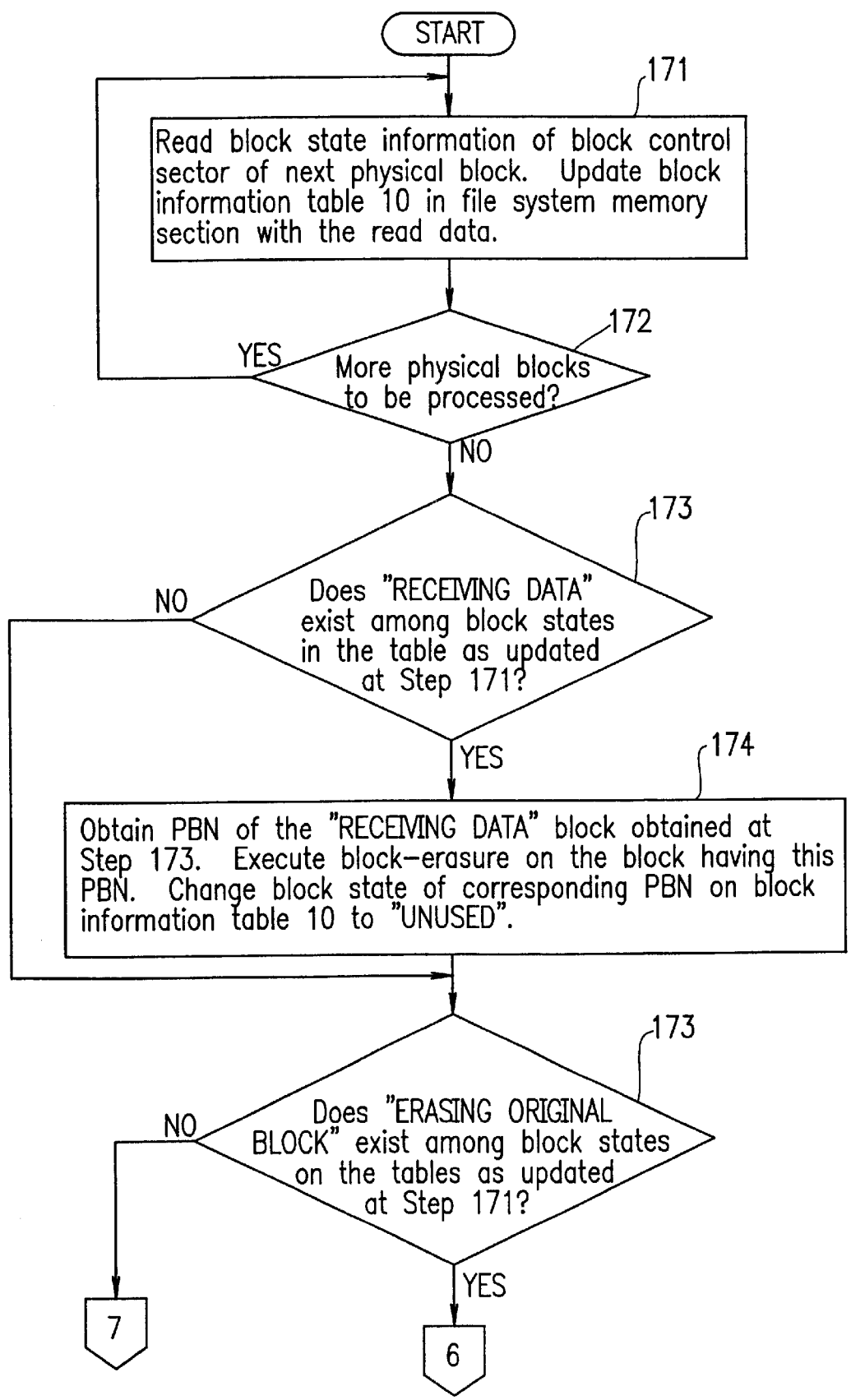
FIGS. 9A to 9D are consecutive flowcharts illustrating an initialization process for the file system 1 according to an example of the present invention.
Figure 9B:
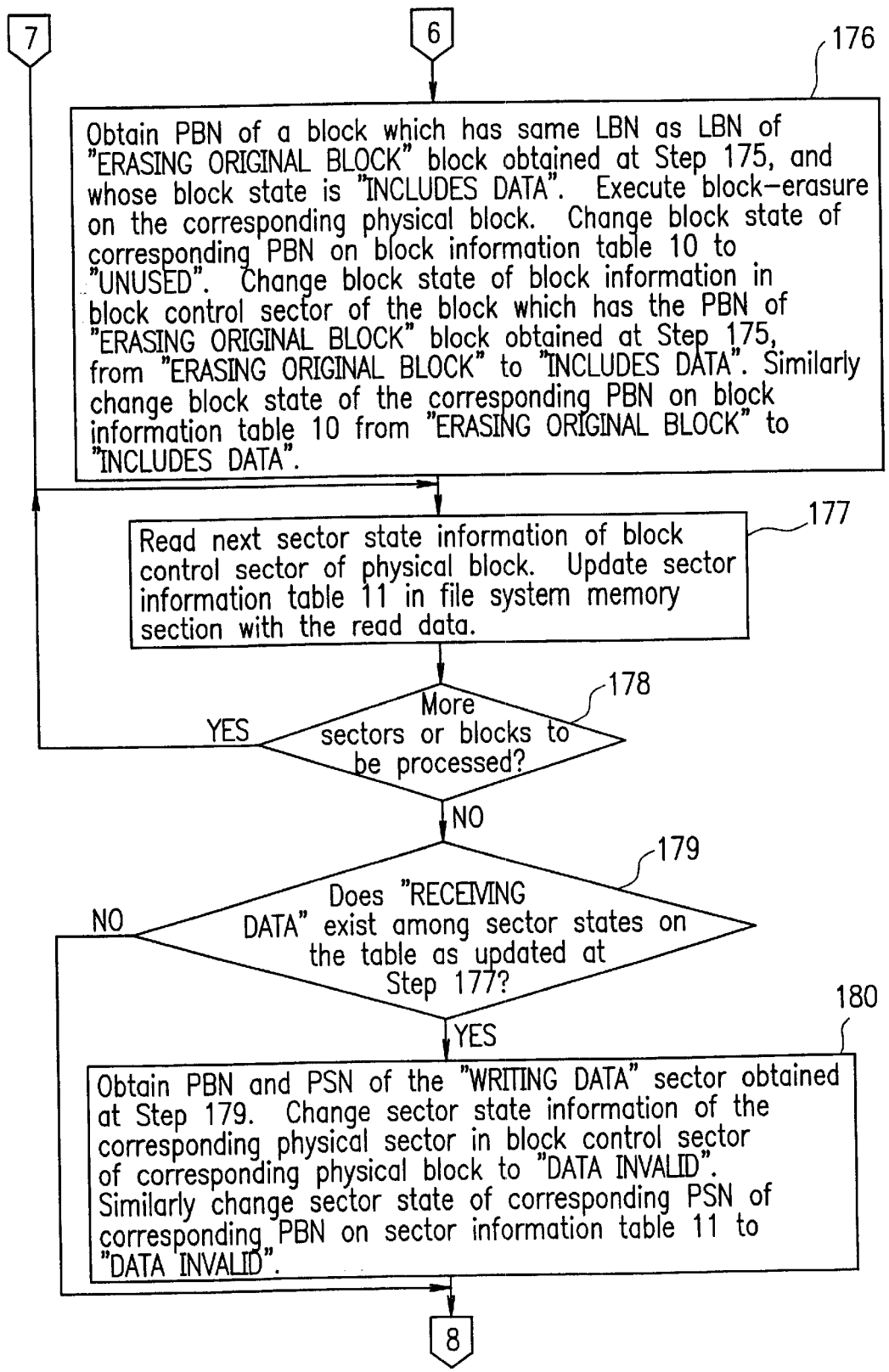
Figure 9C:
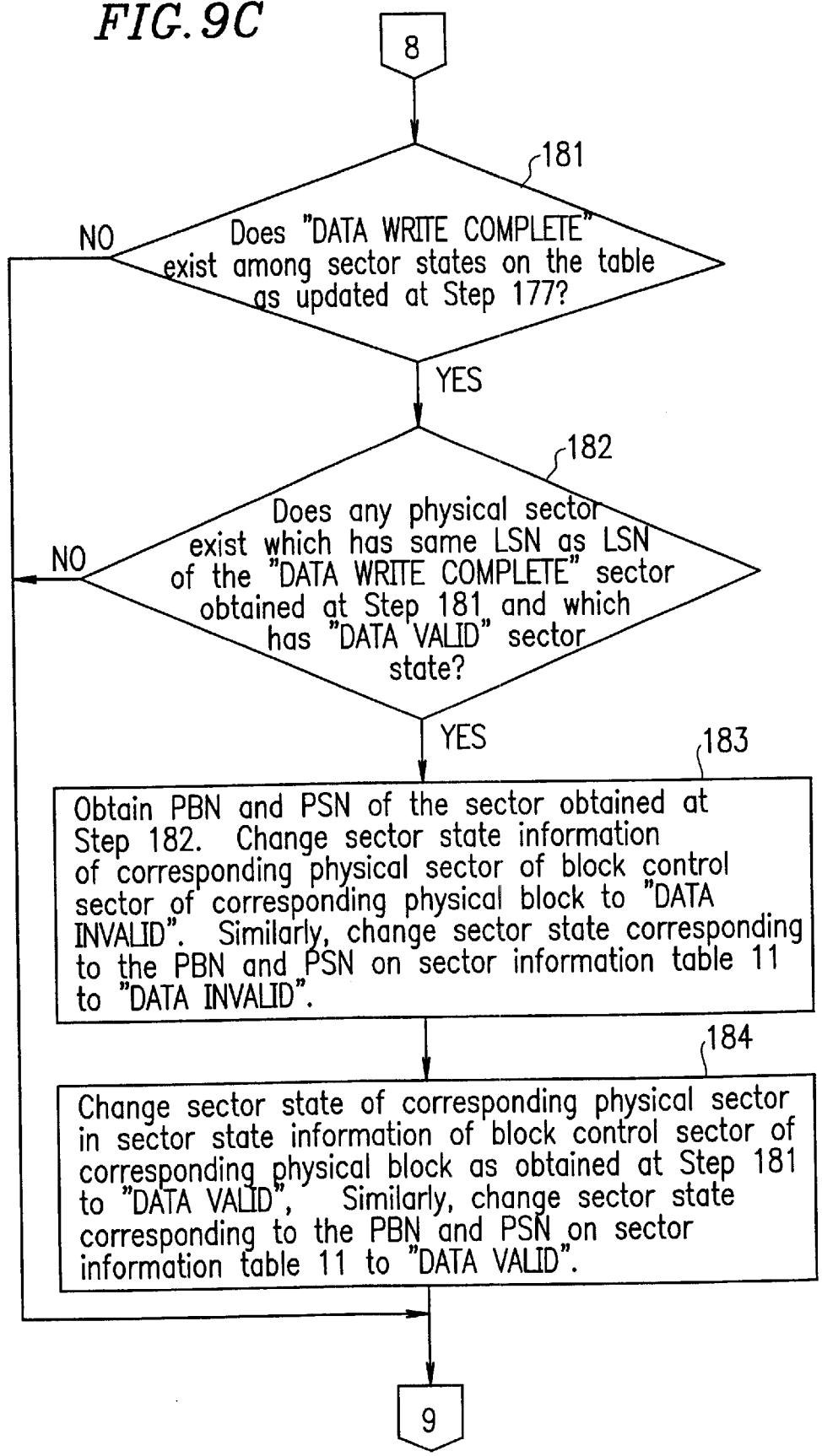
Figure 9D:
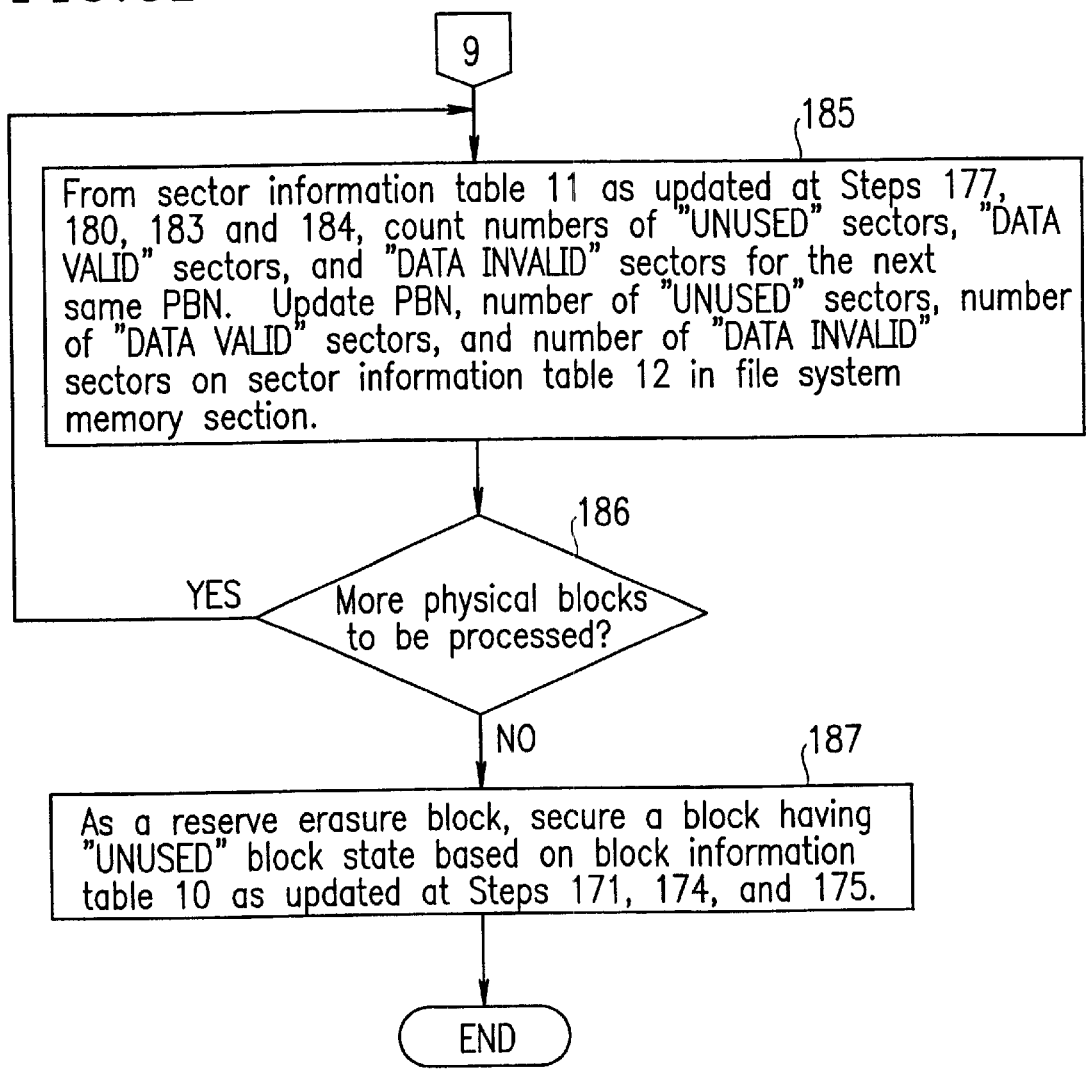
Figure 10:
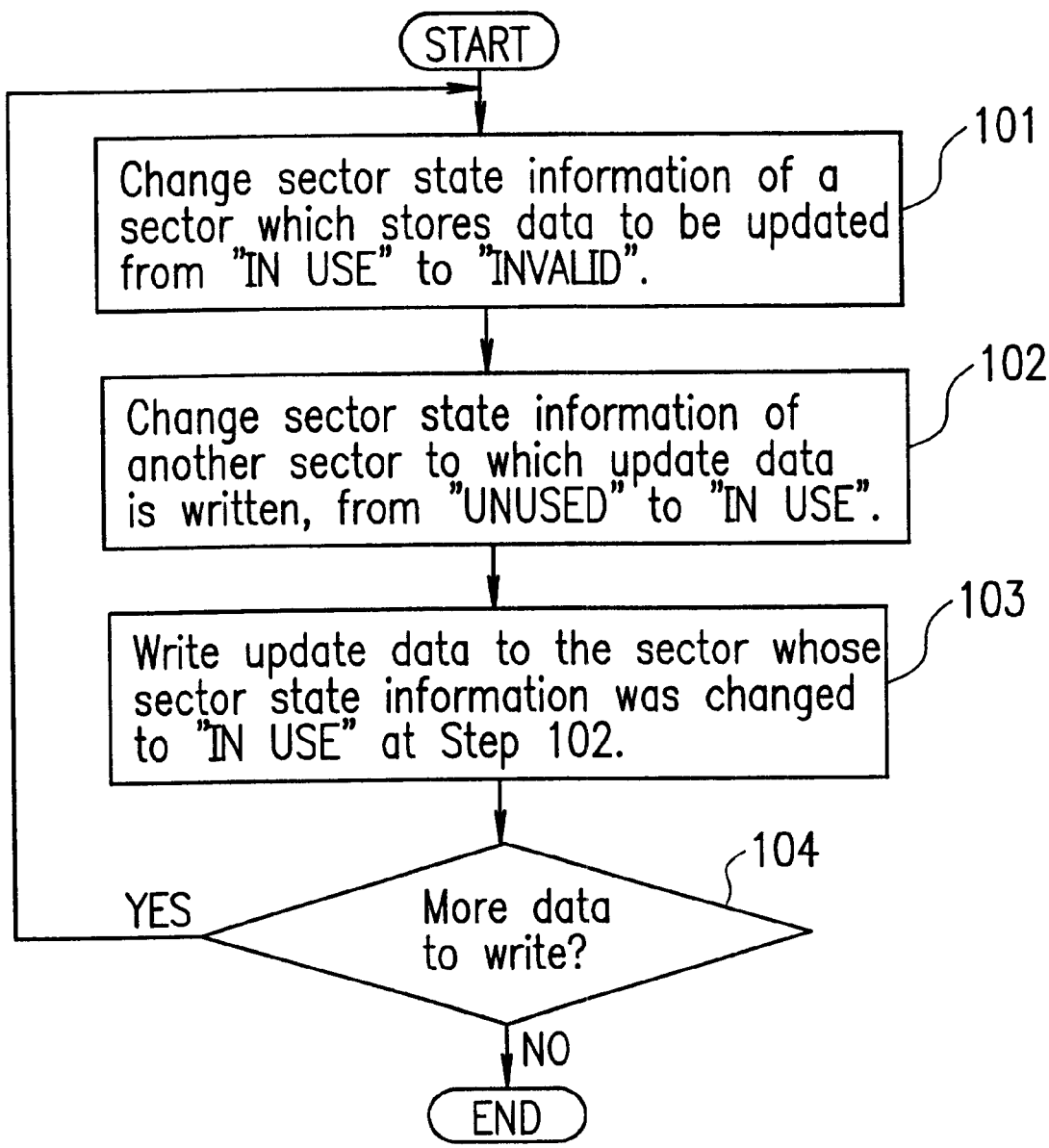
FIG. 10 is a flowchart illustrating an updating process for data stored in a conventional flash memory.
Figure 11:
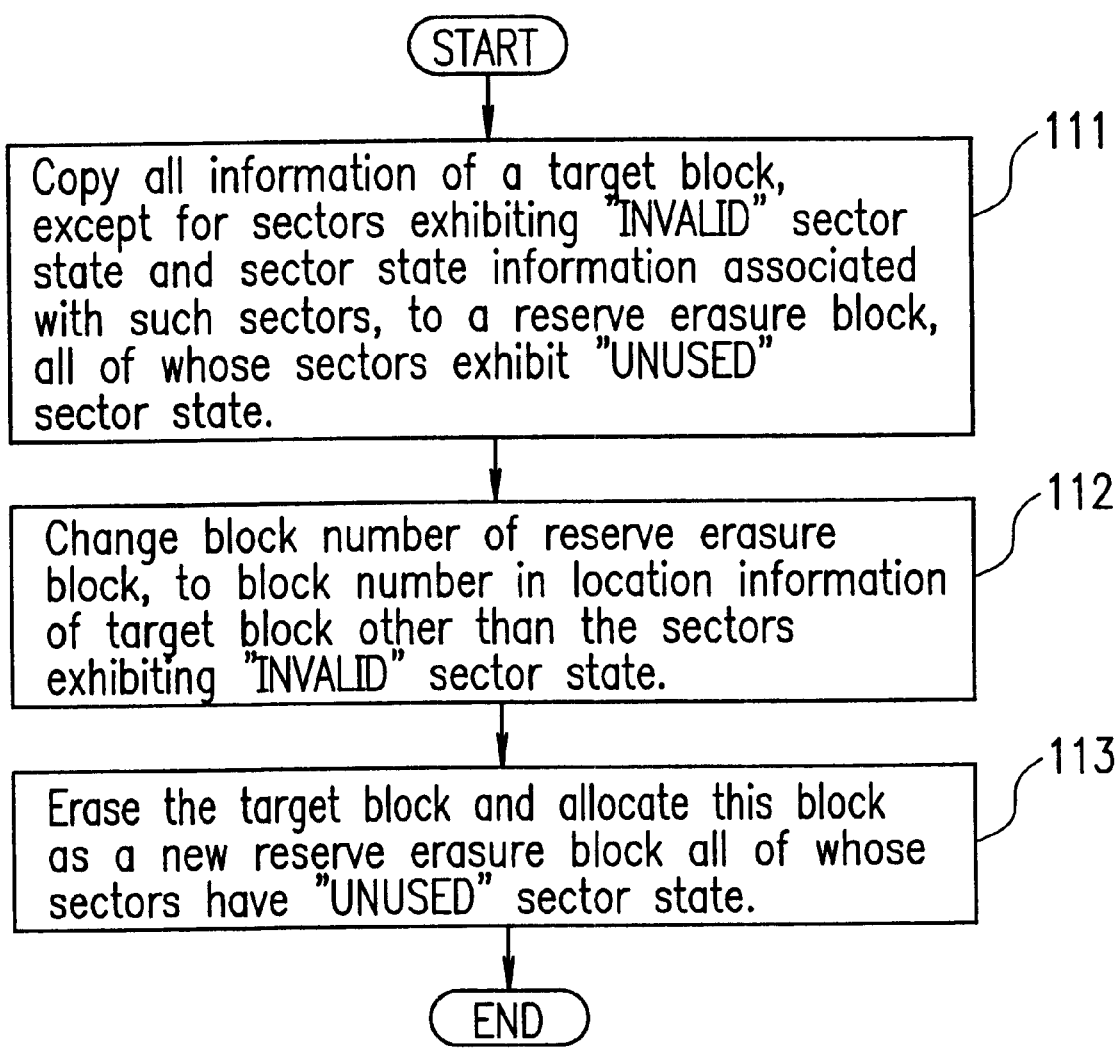
FIG. 11 is a flowchart illustrating a reconstruction process for a file system under the prior art.

At Step 176 shown in FIG. 9B, the file system control section 2 obtains the physical block number of a physical block which has the same logical block number as the logical block number of an erasure block 51 in the "ERASING ORIGINAL BLOCK" block state (as obtained at Step 175) and which has the "INCLUDES DATA" block state. Then, the file system control station 2 accesses the block information table 10 to change the block state associated with this physical block number to "UNUSED". At the same time, the file system control section 2 accesses the flash memory section 5 via the flash memory control section 4, and erases the data in the erasure block 51 having this physical block number. The file system control section 2 changes the block state of the block control sector 52a of the erasure block 51 having the physical block number exhibiting the "ERASING ORIGINAL BLOCK" block state (as obtained at Step 175) from "ERASING ORIGINAL BLOCK" to "INCLUDES DATA", and changes the block state associated with the same physical block number in the block information table 10 to "INCLUDES DATA".

The state information concerning the erasure blocks 51 may indicate a sixth state, e.g., "ORIGINAL BLOCK ERASURE COMPLETE", in addition to "UNUSED", "RECEIVING DATA", "ERASING ORIGINAL BLOCK", "INCLUDES DATA", or "BLOCK FULL". The following flow processes may be performed in the case of employing such six block states, for example.

FIG. 13 is a flowchart illustrating a portion of the initialization process for the file system 1 shown in the flowcharts of FIGS. 9A to 9D that corresponds to Steps 174 to 177 of the aforementioned example.

First, the file system control section 2 accesses the block information table 10 as updated at Step 171 to confirm whether or not the "ORIGINAL BLOCK ERASURE COMPLETE" block state exists (Step 191). If the "ORIGINAL BLOCK ERASURE COMPLETE" block state exists (following the "YES" path from Step 191), the process jumps to Step 194 by skipping Steps 192 and 193.

Next, following the "NO" path from Step 191, the file system control section 2 accesses the block information table 10 as updated at Step 171 to confirm whether or not the "ERASING ORIGINAL BLOCK", block state exists (Step 192).

If the "ERASING ORIGINAL BLOCK" block state exists (following the "YES" path from Step 192), the file system control section 2 obtains the physical block number of a physical block which has the same logical block number as the logical block number of such an erasure block 51 and which has the "INCLUDES DATA" block state. The file system control section 2 accesses the flash memory section 5 via the flash memory control section 4, and erases the data in the erasure block 51 indicated by the obtained physical block number.

Thereafter, the file system control section 2 changes the block state of the block control sector 52 aof the erasure block 51 having the physical block number exhibiting the "ERASING ORIGINAL BLOCK" block state (as obtained at Step 192) from "ERASING ORIGINAL BLOCK" to "ORIGINAL BLOCK ERASURE COMPLETE".

Moreover, the file system control section 2 accesses the block information table 10, and changes the block state associated with the physical block number of the erasure block 51 from which data was erased to "UNUSED" (Step 193).

Next, (or following the "YES" path from Step 191) the file system control section 2 changes the block state of the block control sector 52a of the erasure block 51 having the physical block number which now exhibits "ORIGINAL BLOCK ERASURE COMPLETE" from "ORIGINAL BLOCK ERASURE COMPLETE" to "INCLUDES DATA", and changes the block state in the block information table 10 that is associated with this physical block number from "ERASING ORIGINAL BLOCK" to "INCLUDES DATA" (Step 194).

Next, (or following the "NO" path from Step 192), the control proceeds to Step 177 illustrated in FIG. 9B.

Thus, the addition of the "ORIGINAL BLOCK ERASURE COMPLETE" block state, makes it possible to skip block erasure processes, which may take a relatively long processing time. In other words, in the case where the block state had been changed from "ERASING ORIGINAL BLOCK" to ""ORIGINAL BLOCK ERASURE COMPLETE" immediately before the power supply was interrupted, it is possible to reduce the processing time that is required for the initialization after restoration of the power supply.

Figure 12:
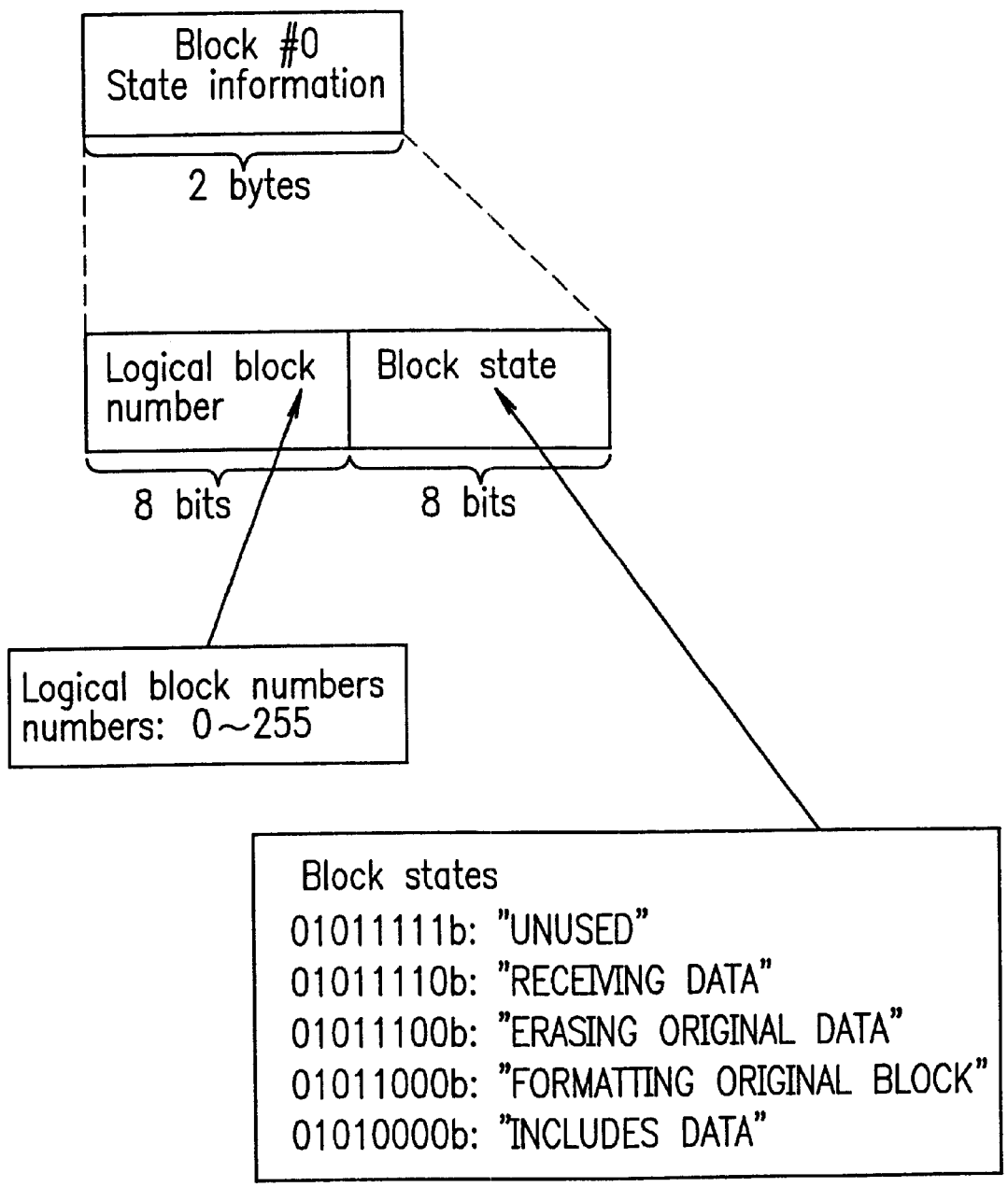
FIG. 12 is a data structure diagram of block states, as indicated by blocs state information, of data stored in the flash memory section 5 of the file system shown in FIG. 1.

In another embodiment, as shown in FIG. 12, it is possible to set any one of the following five states for each erasure block 51: "UNUSED"; "INCLUDES DATA"; "RECEIVING DATA"; "ERASING ORIGINAL BLOCK"; and "FORMATTING ORIGINAL BLOCK".

Such an embodiment may be implemented by a system that incorporates: a means for changing the state information of a reserve erasure block 51 (which is previously secured for use in the reconstruction process) from "UNUSED" to "RECEIVING DATA"; a means for transferring the data stored in the original erasure block 51 (i.e., the erasure block from which data is transferred) to the reserve erasure block 51 and storing the transferred data in the reserve erasure block 51; a means for, after completing the transfer and storage of the data, changing the block state information of the reserve erasure block 51 from "RECEIVING DATA" to "ERASING ORIGINAL BLOCK", erasing the data in the original erasure block 51, securing the original erasure block 51 as a new reserve erasure block 51, and changing the state information of the new reserve erasure block 51 from "INCLUDES DATA" to "UNUSED"; a means for changing the state information of the reserve erasure block 51 which received the transferred data from "ERASING ORIGINAL BLOCK" to "FORMATTING ORIGINAL BLOCK", and writing the number of erasures which may be allowed to be performed for the new reserve erasure block 51 in the new reserve erasure block 51 (this process being referred to as a "formatting"); and a means for, after formatting is completed, changing the state information of the reserve erasure block 51 which received the transferred data from "FORMATTING ORIGINAL BLOCK" to "INCLUDES DATA".

Thus, by utilizing the five states "UNUSED", "INCLUDES DATA", "RECEIVING DATA", "ERASING ORIGINAL BLOCK", and "FORMATTING ORIGINAL BLOCK", it becomes possible to manage the flash memory based on close monitoring of the states of the erasure blocks. As a result, it is possible to automatically restore the file system to a process which was under execution immediately before the power supply was interrupted, without allowing any existing data stored in the flash memory to be destroyed or bringing about inconsistencies in the already existing data.

If an erasure block 51 having the "ERASING ORIGINAL BLOCK" block state is detected during an initialization process of the file system 1 according to another embodiment of the invention performed at the time of the power supply restoration, the data in the original erasure block 51 (i.e., the erasure block 51 from which data was to be transferred) is erased. Alternatively, in order to guarantee the accuracy of the existing data, it may be ensured that the data in the original erasure block 51 is erased not only in the case where an erasure block 51 having the "ERASING ORIGINAL BLOCK" block state is detected, but also in the case where the "FORMATTING ORIGINAL BLOCK" block state is detected during the initialization process.

As opposed to embodiments in which the "BLOCK FULL" block state is used as one indication of the state information of the erasure blocks 51, an embodiment in which the "BLOCK FULL" block state is not used is especially useful in the case where the erasure blocks are divided into unequally-sized sectors in use. The reason is that, in the case of writing data of unequal sizes in consecutive sectors within the same erasure block, it would be difficult to determine whether or not a given erasure block will become "BLOCK FULL" if the size of the data to be written next is unknown.

In another embodiment, the number of erasures which may performed for an erasure block 51 (hereinafter referred to as an "allowable number of erasures for that erasure block 51) may be stored within that erasure block 51 so as to average out the numbers of erases performed for the respective erasure blocks 51.

For example, as a modification of the, embodiment illustrated in FIGS. 8A and 8B, during reconstruction of the file system 1, the file system control section 2 may compare the numbers of erases which may be performed for the erasure blocks 51 other than the reserve erasure block 51, and if the difference between the largest value and the smallest value of the allowable numbers of erases exceeds a predetermined value, then the erasure block 51 having the largest allowable number of erasures may be selected as an original erasure block 51 from which to transfer data; or if the difference does not exceed a predetermined value, the sector information table 12 in the erasure block 51 may be accessed so that an erasure block 51 having the largest number of "DATA INVALID"sectors is selected as an original erasure block 51 from which to transfer data.

In this case, the variation in the allowable numbers of erases of the erasure blocks 51 can be controlled under a predetermined value, whereby the total number of rewrites which can be performed for the entire flash memory can be increased.

The allowable number of erasures to be performed for a given erasure block 51 may be tracked by an incremental method in which the allowable number of erasures is incremented by one from zero up to the maximum allowable number of erasures permitted under the given specifications (in this case, the number of erasures which have actually been performed is being tracked, not the allowable number of erasures to be performed), or by a decremental method in which the allowable number of erasures is decremented by one from the maximum allowable number of erasures permitted under the given specifications down to zero. The decremental method makes it possible to employ a simpler algorithm for determining the allowable number of erasures because the lifetime of that erasure block 51 is known to have expired when the allowable number of erasures reaches zero.

According to another embodiment of the invention, a formatting means for erasure blocks 51 may store the dates and times of instances of formatting. In this case, it is possible to perform a refreshing operation for the data within each erasure block 51 after the lapse of a predetermined time.

As described above, a file system according to the present invention includes at least one non-volatile semiconductor memory device, the at least one non-volatile semiconductor memory device including a plurality of erasure blocks, each erasure block including a plurality of sectors, wherein the file system includes: a file system memory section for storing block state information for each erasure block, the block state information representing one of a plurality of block states, and for storing sector state information for each sector, the sector state information representing one of a plurality of sector states; and a file system control section for, when accessing the at least one non-volatile semiconductor memory device, guaranteeing integrity of data already stored in the at least one non-volatile semiconductor memory device based on the block state information and on the sector state information in the file system memory section.

According to the present invention, block state information representing a plurality of block states and sector state information representing a plurality of sector states are stored in a file system memory section. As a result, if an unexpected the power supply interruption occurs during the operation of a file system, it is possible to manage the lash memory through close and accurate monitoring of block states and sector states (based on the plurality of block states represented by the block state information and the plurality of sector states represented by the sector state information) during an initialization process which is performed at the time of the boot when the power supply is restored later. As a result, it is possible to automatically restore the file system to a process which was under execution immediately before the power supply was interrupted, without allowing any existing data stored in the flash memory to be destroyed or bringing about inconsistencies in the already existing data.

In one embodiment, the file system memory section is provided on a RAM having substantially no constraints concerning data updates, and the file system control section refers to the block state information and the sector state information stored in the RAM when accessing the at least one non-volatile semiconductor memory device.

By utilizing a RAM in this manner, the constraints on data update are eliminated, thereby increasing the processing speed.

In one embodiment, the plurality of block states represented by the block state information comprise the five states of "UNUSED", "INCLUDES DATA", "BLOCK FULL", "RECEIVING DATA", and "ERASING ORIGINAL BLOCK", and the file system control section includes: means for changing the block state information of a first erasure block from "UNUSED" to "RECEIVING DATA", the first erasure block being previously reserved as a reserve erasure block for use in a file system reconstruction process; means for transferring data stored in a second erasure block to the first erasure block and storing the transferred data in the first erasure block; means for, after completing the transfer and storage of the date, changing the block state information of the first erasure block from "RECEIVING DATA" to "ERASING ORIGINAL BLOCK", erasing the data in the second erasure block, reserving the second erasure block as a new reserve erasure block, and changing the block state information of the second erasure block from "INCLUDES DATA" or "BLOCK FULL" to "UNUSED", and means for changing the block state information of the first erasure block from "ERASING ORIGINAL BLOCK" to "INCLUDES DATA".

Thus, by utilizing the five states "UNUSED", "INCLUDES DATA", "BLOCK FULL", "RECEIVING DATA", and "ERASING ORIGINAL BLOCK", it becomes possible to manage the flash memory based on close monitoring of the states of the erasure blocks. As a result, it is possible to automatically restore the file system to a process which was under execution immediately before the power supply was interrupted, without allowing any existing data stored in the flash memory to be destroyed or bringing about inconsistencies in the already existing data.

In one embodiment, the at least one non-volatile semiconductor memory device comprises a plurality of erasure blocks of different block sizes, and at least one erasure block is previously reserved as a reserve erasure block for the erasure blocks of each block size within each non-volatile semiconductor memory device, the reserve erasure block being for use in the file system reconstruction process.

Thus, it becomes possible to select a flash memory from among either equal-block types or boot-block types, depending on the specific purpose and/or cost requirements of each system.

In one embodiment of the invention, the file system comprises a plurality of non-volatile semiconductor memory devices, wherein each non-volatile semiconductor memory device comprises a plurality of erasure blocks of different block sizes, and wherein at least one erasure block is previously reserved as a reserve erasure block for the erasure blocks of each block size throughout the plurality of non-volatile semiconductor memory devices, the reserve erasure block being for use in the file system reconstruction process.

Thus, the number of reserve erasure blocks required by the file system can be reduced, thereby reducing the manufacturing cost of the file system.

In one embodiment, the at least one erasure block previously reserved as a reserve erasure block for use in the file system reconstruction process is equal to or larger in size than any other erasure block.

Thus, it is possible to allocate a block which is larger than 8 Kbytes (e.g., 64 Kbytes) as a reserve erasure block for a boot block which is e.g., 8 Kbytes. Such an arrangement will facilitate the management of the reserve erasure blocks since they are of equal sizes.

Alternatively, a file system according to the present invention includes at least one non-volatile semiconductor memory device, the at least one non-volatile semiconductor memory device including a plurality of sectors, wherein the file system includes: a file system memory section for storing sector state information for each sector, the sector state information representing one of a plurality of sector states; a file system control section for, when accessing the at least one non-volatile semiconductor memory device, guaranteeing integrity of data already stored in the at least one non-volatile semiconductor memory device based on the sector state information in the file system memory section, wherein the plurality of sector states represented by the sector state information comprise the five states of "UNUSED", "WAITING DATA", "DATA WRITE COMPLETE", "DATA VALID", and "DATA INVALID", and wherein the file system control section includes: means for changing the sector state information of a first sector in which data is written from "UNUSED" to "WRITING DATA"; means for changing the sector state information of the first sector from "WRITING DATA" to "DATA WRITE COMPLETE" after the data writing for the first sector is completed; and means for a) when the data written to the first sector is new data, changing the sector state information of the first sector from "DATA WRITE COMPLETE" to "DATA VALID", or b)when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

Thus, sector state information representing five sector states may be stored in the file system memory section according to the present invention. As a result, if an unexpected the power supply interruption occurs during the operation of a file system, it is possible to manage the flash memory through close and accurate monitoring of block states and sector states (based on the plurality of sector states represented by sector state information) during an initialization process which is performed at the time of the boot when the power supply is restored later. As a result, it is possible to automatically restore the file system to a process which was under execution immediately before the power supply was interrupted, without allowing any existing data stored in the flash memory to be destroyed or bringing about inconsistencies in the already existing data.

In one embodiment, the plurality of block states represented by the block state information comprise the six states of "UNUSED", "INCLINES DATA", "BLOCK FULL", "RECEIVING DATA", "ERASING ORIGINAL BLOCK", and "ORIGINAL BLOCK ERASURE COMPLETE", and the file system control section includes: means for changing the block state information of a first erasure block from "UNUSED" to "RECEIVING DATA", the first erasure block being previously reserved as a reserve erasure block for use in a file system reconstruction process; means for transferring data stored in a second erasure block to the first erasure block and storing the transferred data in the first erasure block; means for, after completing the transfer and storage of the data, changing the block state information of the first erasure block from "RECEIVING DATA" to "ERASING ORIGINAL BLOCK", erasing the data in the second erasure block, and changing the block state information of the first erasure block from "ERASING ORIGINAL BLOCK" to "ORIGINAL BLOCK ERASURE COMPLETE"; means for reserving the second erasure block as a new reserve erasure block, and changing the block state information of the second erasure block from "INCLUDES DATA" or "BLOCK FULL" to "UNUSED"; and means for changing the block state information of the first erasure block from "ERASING ORIGINAL BLOCK" to "INCLUDES DATA".

Thus, by utilizing the six states "UNUSED", "INCLUDES DATA", "BLOCK FULL", "RECEIVING DATA", "ERASING ORIGINAL BLOCK", and "ORIGINAL BLOCK ERASURE COMPLETE", it becomes possible to manage the flash memory based on close monitoring of the states of the erasure blocks. As a result, it is possible to automatically restore the file system to a process which was under execution immediately before the power supply was interrupted, without allowing any existing data stored in the flash memory to be destroyed or bringing about inconsistencies in the already existing data.

In one embodiment, the plurality of block states represented by the block state information comprise the five states of "UNUSED", "INCLUDES DATA", "RECEIVING DATA", "ERASING ORIGINAL BLOCK", and "FORMATTING ORIGINAL BLOCK", and the file system control section includes: means for changing the block state information of a first erasure block from "UNUSED" to "RECEIVING DATA", the first erasure block being previously reserved as a reserve erasure block for use in a file system reconstruction process; means for transferring data stored in a second erasure block to the first erasure block and storing the transferred data in the first erasure block; means for, after completing the transfer and storage of the data, changing the block state information of the first erasure block from "RECEIVING DATA" to "ERASING ORIGINAL BLOCK", erasing the data in the second erasure block, reserving the second erasure block as a new reserve erasure block after completing the erasure, and changing the block state information of the second erasure block from "INCLUDES DATA" to "UNUSED"; means for changing the block state information of the first erasure block from "ERASING ORIGINAL BLOCK" to "FORMATTING ORIGINAL BLOCK", and formatting the second erasure block; and means for changing the block state information of the first erasure block from "FORMATTING ORIGINAL BLOCK" to "INCLUDES DATA" after completing the formatting.

In another embodiment, it is possible to set any one of at least the following five states: "UNUSED"; "INCLUDES DATA"; "RECEIVING DATA"; "ERASING ORIGINAL BLOCK"; and "ORIGINAL BLOCK ERASURE COMPLETE". Such an embodiment may be implemented by a system including a file system control section which includes: a means for changing the state information of a reserve erasure block (which is previously secured for use in the reconstruction process) front "UNUSED" to "RECEIVING DATA"; a means for transferring the data stored in the original erasure block (i.e., the erasure block from which data is transferred) to the reserve erasure block and storing the transferred data in the reserve erasure block; a means for, after completing the transfer and storage of the data, changing the block state information of the reserve erasure block from "RECEIVING DATA" to "ERASING ORIGINAL BLOCK", erasing the data in the original erasure block, securing the original erasure block as a new reserve erasure block, and changing the state information of the new reserve erasure block from "INCLUDES DATA" to "UNUSED"; a means for changing the state information of the reserve erasure block which received the transferred data from "ERASING ORIGINAL BLOCK" to "FORMATTING ORIGINAL BLOCK", and writing the number of erasures which may be allowed to be performed for the new reserve erasure block in the new reserve erasure block (this process being referred to as a "formatting"); and a means for, after formatting is completed, changing the state information of the reserve erasure block which received the transferred data from "FORMATTING ORIGINAL BLOCK" to "INCLUDES DATA".

Thus, by utilizing the five states "UNUSED", "INCLUDES DATA", "RECEIVING DATA", "ERASING ORIGINAL BLOCK", and "FORMATTING ORIGINAL BLOCK", it becomes possible to manage the flash memory based on close monitoring of the states of the erasure blocks. As a result, it is possible to automatically restore the file system to a process which was under execution immediately before the power supply was interrupted, without allowing any existing data stored in the flash memory to be destroyed or bringing about inconsistencies in the already existing data.

As opposed to the embodiment in which the "BLOCK FULL" block state may be steals the state information of the erasure blocks, an embodiment in which the "BLOCK FULL" block state is not used is especially useful in the case where the erasure blocks are divided into unequally-sized sectors use. The reason is that, in the case of writing data of unequal sizes in consecutive sectors within the same erasure block, it would be difficult to determine whether or not a given erasure block will become "BLOCK FULL" if the size of the data to be written next is unknown.

In another embodiment, the allowable number of erasures which may performed for an erasure block may be stored within that erasure block so as to average out the numbers of erases performed for the respective erasure blocks. By utilizing the allowable numbers of erases during the reconstruction of the file system, the variation in the allowable numbers of erases of the erasure blocks can be controlled under a predetermined value, whereby the total number of rewrites which can be is performed for the entire flash memory can be increased.

The allowable number of erasures to be performed for a given erasure block may be tracked by an incremental method in which the allowable number of erasures is incremented by one from zero up to the maximum allowable number of erasures permitted under the given specifications (in this case, the number of erasures which have actually been performed is being tracked, not the allowable number of erasures to be performed), or by a decremental method in which the allowable number of erasures is decremented by one from the maximum allowable number of erasures permitted under the given specifications down to zero. The decremental method makes it possible to employ a simpler algorithm for determining the allowable number of erasures because the lifetime of that erasure block is known to have expired when the allowable number of erasures reaches zero.

According to another embodiment of the invention, a formatting means for erasure blocks may store the dates and times of instances of formatting. In this case, it is possible to perform a refreshing operation for the data within each erasure block after the lapse of a predetermined time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A file system comprising at least one non-volatile semiconductor memory device, the at least one non-volatile semiconductor memory device including a plurality of erasure blocks, each erasure block including a plurality of sectors, wherein the file system comprises:
  a file system memory section, separate from a non-volatile semiconductor memory section in which data is stored, for storing block state information for each erasure block, the block state information representing one of a plurality of block states, and for storing sector state information for each sector, the sector state information representing one of a plurality of sector states; and
  a file system control section for, when accessing the at least one non-volatile semiconductor memory device, assuring integrity of data already stored in the at least one non-volatile semiconductor memory device based on the block state information and on the sector state information in the file system memory section.

2. A file system according to claim 1,
  wherein the file system memory section is provided on a RAM having substantially no constraints concerning data updates, and
  wherein the file system control section refers to the block state information and the sector state information stored in the RAM when accessing the at least one non-volatile semiconductor memory device.

3. A file system according to claim 1, wherein the plurality of block states represented by the block state information comprise the file states of "UNUSED", "INCLUDES DATA", "BLOCK FULL", "RECEIVING DATA", and "ERASING ORIGINAL BLOCK", and
  wherein the file system control section comprises:
    means for changing the block state information of a first erasure block from "UNUSED" to "RECEIVING DATA", the first erasure block being previously reserved as a reserve erasure block for use in a file system reconstruction process;
    means for transferring data stored in a second erasure block to the first erasure block and storing the transferred data in the first erasure block;
    means for, after completing the transfer and storage of the data, changing the block state information of the first erasure block from "RECEIVING DATA" to "ERASING ORIGINAL BLOCK", erasing the data in the second erasure block, reserving the second erasure block as a new reserve erasure block, and changing the block state information of the second erasure block from "INCLUDES DATA" or "BLOCK FULL" to "UNUSED"; and
    means for changing the block state information of the first erasure block from "ERASING ORIGINAL BLOCK" to "INCLUDES DATA".

4. A file system according to claim 3,
  wherein the at least one non-volatile semiconductor memory device comprises a plurality of erasure blocks of different block sizes, and
  wherein at least one erasure block is previously reserved as a reserve erasure block for the erasure blocks of each block size within each non-volatile semiconductor memory device, the reserve erasure block being for use in the file system reconstruction process.

5. A file system according to claim 3,
  wherein the file system comprises a plurality of non-volatile semiconductor memory devices,
  wherein each non-volatile semiconductor memory device comprises a plurality of erasure blocks of different block sizes, and
  wherein at least one erasure block is previously reserved as a reserve erasure block for the erasure blocks of each block size throughout the plurality of non-volatile semiconductor memory devices, the reserve erasure block being for use in the file system reconstruction process.

6. A file system according to claim 4, wherein the at least one erasure block previously reserved as a reserve erasure block for use in the file system reconstruction process is equal to or larger in size than any other erasure block.

7. A file system according to claim 5, wherein the at least one erasure block previously reserved as a reserve erasure block for use in the file system reconstruction process is equal to or larger in size than any other erasure block.

8. A file system comprising at least one non-volatile semiconductor memory device, the at least one non-volatile semiconductor memory device including a plurality of sectors,
  wherein the file system comprises:
    a file system memory section, separate from a non-volatile semiconductor memory section in which data is stored, for storing sector state information for each sector, the sector state information representing one of a plurality of sector states;
    a file system control section for, when accessing the at least one non-volatile semiconductor memory device, assuring integrity of data already stored in the at least one non-volatile semiconductor memory device based on the sector state information in the file system memory section,
  wherein the plurality of sector states represented by the sector state information comprise the five states of "UNUSED", "WRITING DATA", "DATA WRITE COMPLETE", "DATA VALID", and "DATA INVALID", and
  wherein the file system control section comprises:
    means for changing the sector state information of a first sector in which data is written from "UNUSED" to "WRITING DATA";
    means for changing the sector state information of the first sector from "WRITING DATA" to "DATA WRITE COMPLETE" after the data writing for the first sector is completed; and
    means for a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID", and thereafter changing the sector state information of the first sector from "DATA WRITE COMPLETE" to "DATA VALID".

9. A file system according to claim 3, wherein the file system control section comprises:
  means for, during initialization of the file system performed when the power supply is restored, searching among the plurality of erasure blocks for an erasure block having the "ERASING ORIGINAL BLOCK" block state information, and if an erasure block having the "ERASING ORIGINAL BLOCK" block state information exists, locating a further erasure block which has the same logic block number as a logic block number of the erasure block having the "ERASING ORIGINAL BLOCK" block state information and which has the "INCLUDES DATA" to "BLOCK FULL" block state information based on the block state information in the file system memory section,
  means for erasing data in the further erasure block, and after completing the erasure, changing the block state information of the further erasure block from "INCLUDES DATA" or "BLOCK FULL" to "UNUSED", and means for changing the state information of the erasure block having the "ERASING ORIGINAL BLOCK" block state information from "ERASING ORIGINAL BLOCK" to "INCLUDES DATA".

10. A file system according to claim 1, wherein the plurality of block states represented by the block state information comprise the five states of "UNUSED", "INCLUDES DATA", "RECEIVING DATA", "ERASING ORIGINAL BLOCK", and "FORMATTING ORIGINAL BLOCK", and wherein the file system control section comprises:

means for changing the block state information of a first erasure block from "UNUSED" to "RECEIVING DATA", the first erasure block being previously reserved as a reserve erasure block for use in a file system reconstruction process;

means for transferring date stored in a second erasure block to the first erasure block and storing the transferred data in the first erasure block;

means for, after completing the transfer and storage of the data, changing the block state information of the first erasure block from "RECEIVING DATA" to "ERASING ORIGINAL BLOCK", erasing the data in the second erasure block, reserving the second erasure block as a new reserve erasure block after completing the erasure, and changing the block state information of the second erasure block from "INCLUDES DATA" to "UNUSED";

means for changing the block state information of the first erasure block from "ERASING ORIGINAL BLOCK" to "FORMATTING ORIGINAL BLOCK", and formatting the second erasure block; and means for changing the block state information of the first erasure block from "FORMATTING ORIGINAL BLOCK" to "INCLUDES DATA" after completing the formatting.

11. A file system according to claim 10, wherein each erasure block stores therein an allowable number of erasures to be performed for the erasure block, and wherein the file system control section comprises:

means for, during the formatting, storing in the second erasure block a number obtained by subtracting one from the allowable number of erasures previously stored in the second erasure block; and means for, during the file system reconstruction process, selecting as the first erasure block an erasure block having a largest allowable number of erasures among all of the plurality of erasure blocks except for the reserve erasure block.

12. A file system according to, claim 11, wherein each erasure block is banned from use when the allowable number of erasures of the erasure block equals zero or less.

13. A file system according to claim 10, wherein each erasure block stores therein a number of erasures having been performed for the erasure block, and wherein the file system control section comprises:

means for, during the formatting, storing in the second erasure block a number obtained by adding one to the number of erasures previously stored in the second erasure block; and means for, during the file system reconstruction process, selecting as the first erasure block an erasure block having a smallest number of erasures among all of the plurality of erasure blocks except for the reserve erasure block.

14. A file system according to claim 13, wherein each erasure block is banned from use when the number of erasures having been performed for the erasure block has exceeded a largest value permitted by specifications of the at least one non-volatile semiconductor memory device.

15. A file system according to claim 10, wherein the at least one non-volatile semiconductor memory device comprises a plurality of erasure blocks of different block sizes, and wherein at least one erasure block is previously reserved as a reserve erasure block for the erasure blocks of each block size within each non-volatile semiconductor memory device, the reserve erasure block being for use in the file system reconstruction process.

16. A file system according to claim 10, wherein the file system comprises a plurality of non-volatile semiconductor memory devices, wherein each non-volatile semiconductor memory device comprises a plurality of erasure blocks of different block sizes, and wherein at least one erasure block is previously reserved as a reserve erasure block for the erasure blocks of each block size throughout the plurality of non-volatile semiconductor memory devices, the reserve erasure block being for use in the file system reconstruction process.

17. A file system according to claim 15, wherein the at least one erasure block previously reserved as a reserve erasure block for use in the file system reconstruction process is equal to or larger in size than any other erasure block.

18. A file system according to claim 16, wherein the at least one erasure block previously reserved as a reserve erasure block for use in the file system reconstruction process is equal to or larger in size than any other erasure block.

19. A file system according to claim 10, wherein the file system control section comprises:

means for, during initialization of the file system performed when the power supply is restored, searching among the plurality of erasure blocks for an erasure block having the "ERASING ORIGINAL BLOCK" block state information, and if an erasure block having the "ERASING ORIGINAL BLOCK" block state information exists, locating a further erasure block from which data is to be transferred to the erasure block having the "ERASING ORIGINAL BLOCK" block state information, based on the block state information in the file system memory section, means for erasing data in the further erasure block, and after completing the erasure, changing the block state information of the further erasure block from "INCLUDES DATA" to "UNUSED", means for changing the block state information of the erasure block having the "ERASING ORIGINAL BLOCK" block state information from "ERASING ORIGINAL BLOCK" to "FORMATTING ORIGINAL BLOCK", formatting the erased further erasure block, and reserving the formatted erasure block as a new reserve erasure block; and means for changing the block state information of the erasure block having the "FORMATTING ORIGINAL BLOCK" block state information from "FORMATTING ORIGINAL BLOCK" to "INCLUDES DATA" after completing the formatting.

20. A file system according to claim 10, wherein the file system control section comprises:

means for, during initialization of the file system performed when the power supply is restored, searching among the plurality of erasure blocks for an erasure block having the "FORMATTING ORIGINAL BLOCK" block state information, and if an erasure block having the "FORMATTING ORIGINAL BLOCK" block state information exists, locating a further erasure block from which data is to be transferred to the erasure block having the "FORMATTING ORIGINAL BLOCK" block state information, based on the block state information in the file system memory section, means for formatting the further erasure block, and reserving the formatted erasure block as a new reserve erasure block; and means for changing the block state information of the erasure block having the "FORMATTING ORIGINAL BLOCK" block state information from "FORMATTING ORIGINAL BLOCK" to "INCLUDES DATA" after completing the formatting.

21. A method for managing a file system comprising at least one non-volatile semiconductor memory device, the at least one non-volatile semiconductor memory device including a plurality of erasure blocks, each erasure block including a plurality of sectors, the method comprising the steps of:

storing in a file system memory section, separate from a non-volatile semiconductor memory section in which data is stored, block state information for each erasure block, the block state information representing one of a plurality of block states, storing in the file system memory section, separate from the non-volatile semiconductor memory section in which data is stored, sector state information for each sector, the sector state information representing one of a plurality of sector states; and when accessing the at least one non-volatile semiconductor memory device, assuring integrity of data already stored in the at least one non-volatile semiconductor memory device based on the block state information and on the sector state information in the file system memory section.

22. A method for managing a file system comprising at least one non-volatile semiconductor memory device, the at least one non-volatile semiconductor memory device including a plurality of sectors, wherein the file system comprises:

a file system memory section, separate from a non-volatile semiconductor memory section in which data is stored, for storing sector state information for each sector, the sector state information representing one of a plurality of sector states;

a file system control section for, when accessing the at least one non-volatile semiconductor memory device, assuring integrity of data already stored in the at least one non-volatile semiconductor memory device based on the sector state information in the file system memory section, wherein the plurality of sector states represented by the sector state information comprise the five states of "UNUSED", "WRITING DATA", "DATA WRITE COMPLETE", "DATA VALID", and "DATA INVALID", and wherein the method comprises:

a step of changing the sector state information of a first sector in which data is written from "UNUSED" to "WRITING DATA";

a step of changing the sector state information of the first sector from "WRITING DATE" to "DATE WRITE COMPLETE" after the data writing for the first sector is completed; and a step of a) when the data written to the first sector is new data, changing the sector state information of the first sector from "DATA WRITE COMPLETE" to "DATA VALID", or b) when the data written to the sector is update data of existing data, changing the sector state information of a second sector from "DATA VALID" to "DATA INVALID" and thereafter changing the sector state information of the first sector from "DATA WRITE COMPLETE" to "DATA VALID".

* * * * *